(12) United States Patent
Cheng et al.

(10) Patent No.: US 12,355,355 B2
(45) Date of Patent: Jul. 8, 2025

(54) SWITCHING POWER CONVERTER CIRCUIT AND CONVERSION CONTROL CIRCUIT AND METHOD THEREOF

(71) Applicant: Richtek Technology Corporation, Zhubei (TW)

(72) Inventors: Hung-Yu Cheng, Taipei (TW); Wan-Hsuan Yang, Hsinchu (TW); Chi-Hsun Wu, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 219 days.

(21) Appl. No.: 18/453,586

(22) Filed: Aug. 22, 2023

(65) Prior Publication Data

US 2024/0097567 A1 Mar. 21, 2024

(30) Foreign Application Priority Data

Sep. 20, 2022 (TW) .................. 111135536

(51) Int. Cl.
*H02M 3/158* (2006.01)
*H02M 1/00* (2006.01)
(Continued)

(52) U.S. Cl.
CPC ......... *H02M 3/158* (2013.01); *H02M 1/0025* (2021.05); *H02M 1/088* (2013.01); *H03K 7/08* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135;
(Continued)

(56) References Cited

U.S. PATENT DOCUMENTS 7,646,189 B2 * 1/2010 Chen ............... H02M 3/156 323/283
9,553,514 B2 * 1/2017 Masuko .......... H02M 3/156
(Continued)

*Primary Examiner* — Jeffrey A Gblende
(74) *Attorney, Agent, or Firm* — Tung & Associates

(57) ABSTRACT

A conversion control circuit is configured to generate a PWM (pulse width modulation) signal to control a power switch for switching an inductor to convert an input voltage to an output voltage. The steps of generating the PWM signal includes: enabling the PWM signal at a rising edge of a clock signal to turn on the power switch; disabling the PWM signal to turn off the power switch when an on-time exceeds a predetermined minimum on-time and the output voltage has reached an output level; triggering a next rising edge of the clock signal when the off-time exceeds a predetermined minimum off-time, the output voltage has not reached the output level, and a present cycle period of the clock signal has reached a predetermined cycle period.

17 Claims, 18 Drawing Sheets

(51) Int. Cl.
*H02M 1/088* (2006.01)
*H03K 7/08* (2006.01)

(58) Field of Classification Search
CPC ........ H02M 3/145; H02M 3/15; H02M 3/155;
H02M 3/156; H02M 3/157; H02M 3/158;
H02M 1/346; H02M 3/1588; H02M
2003/1566; H02M 3/1582; H02M 3/1584;
H02M 2003/1557; H02M 1/0032; H02M
1/4225; H02M 7/217; H02M 1/0025;
H02M 1/0045; H02M 1/0009; H02M
1/08; H02M 1/088; H02M 1/0048; H05B
39/048; B23K 11/24; H04B 2215/069
See application file for complete search history.

(56) References Cited

U.S. PATENT DOCUMENTS

| 10,644,600 B2* | 5/2020 | Wu ...................... H02M 3/1563 |
| 2022/0085717 A1* | 3/2022 | Hung .................. H02M 1/0025 |

\* cited by examiner

SWITCHING POWER CONVERTER CIRCUIT AND CONVERSION CONTROL CIRCUIT AND METHOD THEREOF

CROSS REFERENCE

The present invention claims priority to TW 111135536 filed on Sep. 20, 2022.

BACKGROUND OF THE INVENTION

Field of Invention

The present invention relates to a switching power conversion circuit, and more particularly, to a switching power conversion circuit with an adaptively adjustable switching cycle period to provide a wide range of conversion ratios. The present invention also relates to a conversion control circuit and method for controlling the switching power conversion circuit.

Description of Related Art

The prior art related to the present invention includes: U.S. Pat. No. 11,031,869B2.

The conversion ratio (duty) of the input voltage to the output voltage of a switching power converter (such as a buck switching power converter) theoretically ranges from 0 to 1, but practically, the control signal for controlling the switching power converter has a preset minimum on-time and a preset minimum off-time, so in a switching power converter whose frequency is determined by an oscillation circuit, the actual conversion ratio has an upper limit value less than 1 and a lower limit value greater than 0, that is, the applicable output voltage and/or input voltage cannot be further increased or decreased due to the limitation of the conversion ratio.

In view of this drawback, the present invention proposes a switching power conversion circuit and a conversion control circuit and method thereof, wherein the on-time or off-time of the control signal can be extended to increase the cycle period of the control signal, so that the conversion ratio can be closer to 0 or 1 to expand the applicable range of the output voltage and/or the input voltage.

SUMMARY OF THE INVENTION

From one perspective, the present invention provides a conversion control circuit configured to control a power stage circuit, wherein the power stage circuit comprises a power switch, a switching device and an inductor which are coupled to one another, the power switch and the switching device are configured to switch the inductor to convert an input power to generate an output power, wherein the conversion control circuit comprises: an error amplification circuit, configured to generate an error amplified signal according to a feedback signal relevant to the output power and a reference signal; a ramp signal generating circuit, configured to generate a ramp signal; and a pulse width modulation (PWM) circuit, configured to generate a PWM signal according to the error amplified signal and the ramp signal, wherein the power switch is switched according to the PWM signal; the PWM circuit comprising: a modulation comparison circuit, configured to compare the error amplified signal and the ramp signal to generate a modulation comparison signal; an adjustable oscillation circuit, configured to generate a clock signal according to the modulation comparison signal, wherein the clock signal is adjustable and has a preset cycle period; and a logic circuit, configured to generate the PWM signal according to the modulation comparison signal and the clock signal; wherein the PWM circuit generates the PWM signal according to following steps: S1: triggering the clock signal to generate a first changing edge; S2: enabling the PWM signal at the first changing edge to control the power switch to be turned on; S3: when an on-time after the PWM signal is enabled exceeds a preset minimum on-time, and when the modulation comparison signal indicates that an electrical characteristic of the output power reaches an output level, disabling the PWM signal to control the power switch to be turned off; and S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

In one preferable embodiment, the PWM circuit disables the PWM signal only when the modulation comparison signal indicates that the electrical characteristic of the output power reaches the output level, and after the PWM signal is disabled, the PWM signal is maintained disabled for at least the preset minimum off-time, and thereafter the step S1 is repeated, so that when a sum of the on-time and the preset minimum off-time is greater than the preset cycle period, the present cycle period of the clock signal is adaptively extended, whereby a ratio of the on-time to the present cycle period corresponds to a conversion ratio of an output voltage of the output power to an input voltage of the input power; wherein the PWM circuit repeats the step S1 when the modulation comparison signal indicates that the electrical characteristic of the output power does not reach the output level, so that when a sum the off-time and the preset minimum on-time is greater than the preset cycle period, the present cycle period is adaptively extended, whereby the ratio of the on-time to the present cycle period corresponds to the conversion ratio.

In one preferable embodiment, an inductor current flowing through the inductor is greater than or equal to zero.

In one preferable embodiment, the step S3 further comprises: when the power stage circuit operates in a discontinuous conduction mode (DCM), the PWM signal is disabled only when the inductor current is determined to exceed a preset minimum current threshold.

In one preferable embodiment, the on-time corresponding to the inductor current reaching the preset minimum current threshold is greater than or equal to the preset minimum on-time.

In one preferable embodiment, the step S1 further comprises controlling the clock signal to change to a first state at the first changing edge, wherein the PWM circuit further generates the clock signal according to a timing procedure, wherein the timing procedure comprises: S51: timing a preset first cycle period of the clock signal after the clock signal changes to the first state; S52: triggering a second changing edge of the clock signal at an end of the preset first cycle period to control the clock signal to change to a second state; S53: timing a preset second cycle period of the clock signal after the clock signal changes to the second state, wherein a sum of the preset first cycle period and the preset second cycle period is the preset cycle period; and S54:

enabling a timing signal at an end of the preset second cycle period, wherein the timing signal indicates that the present cycle period has reached the preset cycle period; wherein the step S4 further comprises: repeating the step S1 only after the timing signal determines that the present cycle period has reached the preset cycle period.

In one preferable embodiment, the adjustable oscillation circuit comprises: a first timing circuit, configured to time the preset first cycle period according to a trigger signal, and to generate a first phase signal accordingly, wherein the first phase signal indicates the preset first cycle period, and the clock signal is relevant to the first phase signal; a second timing circuit, configured to start timing the preset second cycle period of the clock signal from the end of the preset first cycle period and to generate a second phase signal accordingly, wherein the second phase signal indicates the preset second cycle period, wherein the second phase signal is or corresponds to the timing signal; and a cycle period adjustment circuit, configured to control the clock signal to maintain at the second state until the off-time exceeds the preset minimum off-time after the second phase signal indicates that the preset second cycle period has expired, and to trigger the trigger signal when the modulation comparison signal indicates that the electrical characteristic of the output power does not reach the output level.

In one preferable embodiment, the first timing circuit comprises: a first current source, configured to generate a first current; a first capacitor, configured to generate a first integration voltage according to an integration of the first current; a first reset switch, configured to reset the first integration voltage according to the trigger signal; and a first comparison circuit, configured to compare the first integration voltage with the reference signal to generate the first phase signal; and the second timing circuit comprises: a second current source, configured to generate a second current; a second capacitor, configured to generate a second integration voltage according to an integration of the second current; a second reset switch, configured to reset the second integration voltage according to the first phase signal indicated to timing the preset first cycle period; and a second comparison circuit, configured to compare the second integration voltage with the reference signal to generate the second phase signal.

In one preferable embodiment, the ramp signal is relevant to an inductor current flowing through the inductor.

In one preferable embodiment, the ramp signal is relevant to the PWM signal.

From another perspective, the present invention provides a switching power conversion circuit, comprising: a power stage circuit, configured to convert an input power to an output power, wherein the power stage circuit comprises a power switch, a switching device and an inductor coupled to one another; a conversion control circuit configured to control the power stage circuit according to a feedback signal, thereby converting the input power to the output power; and a feedback circuit, configured to generate the feedback signal according to the output power, wherein the conversion control circuit comprises: an error amplification circuit, configured to generate an error amplified signal according to a feedback signal relevant to the output power and a reference signal; a ramp signal generating circuit, configured to generate a ramp signal; and a pulse width modulation (PWM) circuit, configured to generate a PWM signal according to the error amplified signal and the ramp signal, wherein the power switch is switched according to the PWM signal; the PWM circuit comprising: a modulation comparison circuit, configured to compare the error amplified signal and the ramp signal to generate a modulation comparison signal; an adjustable oscillation circuit, configured to generate a clock signal according to the modulation comparison signal, wherein the clock signal is adjustable and has a preset cycle period; and a logic circuit, configured to generate the PWM signal according to the modulation comparison signal and the clock signal; wherein the PWM circuit generates the PWM signal according to following steps: S1: triggering the clock signal to generate a first changing edge; S2: enabling the PWM signal at the first changing edge to control the power switch to be turned on; S3: when an on-time after the PWM signal is enabled exceeds a preset minimum on-time, and when the modulation comparison signal indicates that an electrical characteristic of the output power reaches an output level, disabling the PWM signal to control the power switch to be turned off; and S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

From another perspective, the present invention provides a method for controlling a switching power conversion circuit, the switching power conversion circuit comprising: a power switch, a switching device and an inductor coupled to one another, the power switch and the switching device used to switch the inductor to convert an input power to generate an output power, the method comprising: generating a modulation comparison signal according to a feedback signal, wherein the modulation comparison signal indicates whether an electrical characteristic of the output power reaches an output level; generating a clock signal, wherein the clock signal is adjustable and has a preset cycle period; and generating a PWM signal according to the modulation comparison signal and the clock signal for controlling the power switch; wherein the step of generating the PWM signal comprises: S1: triggering the clock signal to generate a first changing edge; S2: enabling the PWM signal at the first changing edge to control the power switch to be turned on; S3: when an on-time after the PWM signal is enabled exceeds a preset minimum on-time, and when the modulation comparison signal indicates that an electrical characteristic of the output power reaches an output level, disabling the PWM signal to control the power switch to be turned off; and S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

In one preferable embodiment, the switching power conversion circuit disables the PWM signal only when the modulation comparison signal indicates that the electrical characteristic of the output power reaches the output level, and after the PWM signal is disabled, the PWM signal is maintained disabled for at least the preset minimum off-time, and thereafter the step S1 is repeated, so that when a sum of the on-time and the preset minimum off-time is greater than the preset cycle period, the present cycle period of the clock signal is adaptively extended, whereby a ratio of the on-time to the present cycle period corresponds to a conversion ratio of an output voltage of the output power to an input voltage of the input power; wherein the switching power conversion circuit repeats the step S1 when the modulation comparison signal indicates that the electrical characteristic of the output power does not reach the output level, so that when a sum the off-time and the preset minimum on-time is greater than the preset cycle period, the present cycle period is adaptively extended, whereby the ratio of the on-time to the present cycle period corresponds to the conversion ratio.

In one preferable embodiment, an inductor current flowing through the inductor is greater than or equal to zero.

In one preferable embodiment, the step S3 further comprises: when the power stage circuit operates in a discontinuous conduction mode (DCM), the PWM signal is disabled only when the inductor current is determined to exceed a preset minimum current threshold.

In one preferable embodiment, the on-time corresponding to the inductor current reaching the preset minimum current threshold is greater than or equal to the preset minimum on-time.

In one preferable embodiment, the step S1 further comprises controlling the clock signal to change to a first state at the first changing edge, wherein the PWM circuit further generates the clock signal according to a timing procedure, wherein the timing procedure comprises: S51: timing a preset first cycle period of the clock signal after the clock signal changes to the first state; S52: triggering a second changing edge of the clock signal at an end of the preset first cycle period to control the clock signal to change to a second state; S53: timing a preset second cycle period of the clock signal after the clock signal changes to the second state, wherein a sum of the preset first cycle period and the preset second cycle period is the preset cycle period; and S54: enabling a timing signal at an end of the preset second cycle period, wherein the timing signal indicates that the present cycle period has reached the preset cycle period; wherein the step S4 further comprises: repeating the step S1 only after the timing signal determines that the present cycle period has reached the preset cycle period.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
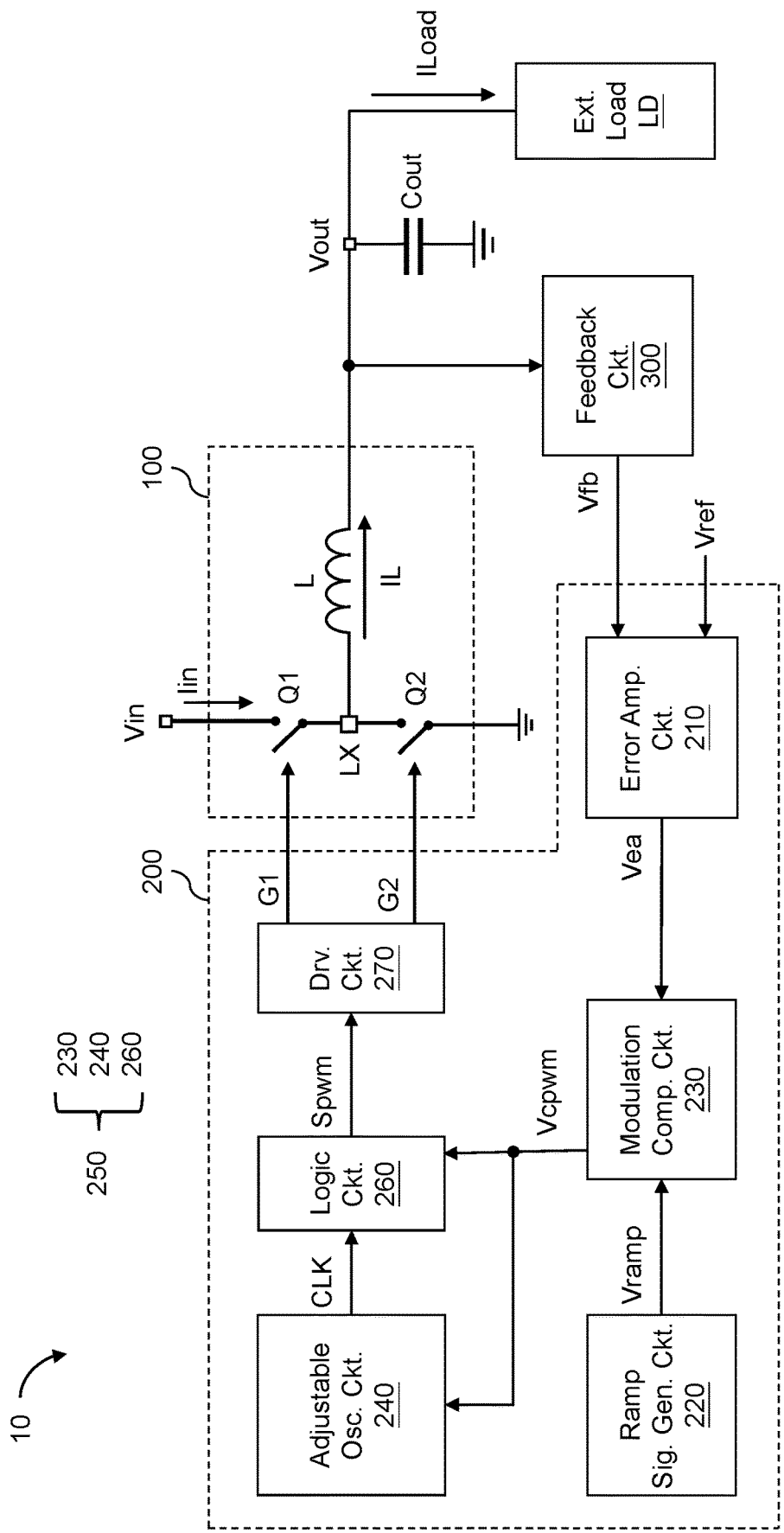
FIG. 1 is a block diagram of a switching power conversion circuit according to an embodiment of the present invention.
Figure 2A:
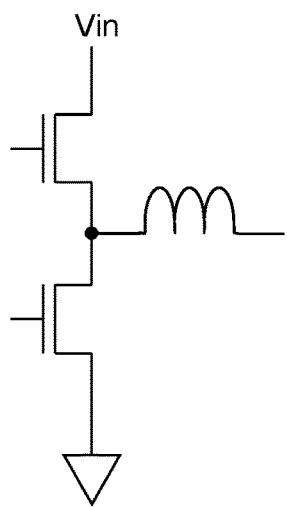
FIGS. 2A to 2K are schematic circuit diagrams of power stage circuits according to several embodiments of the present invention.
Figure 2B:
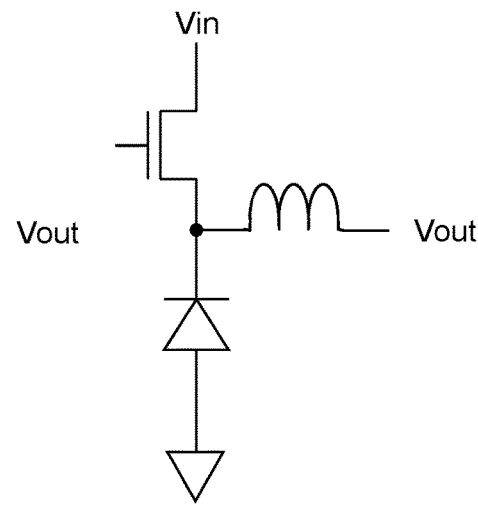
Figure 2C:
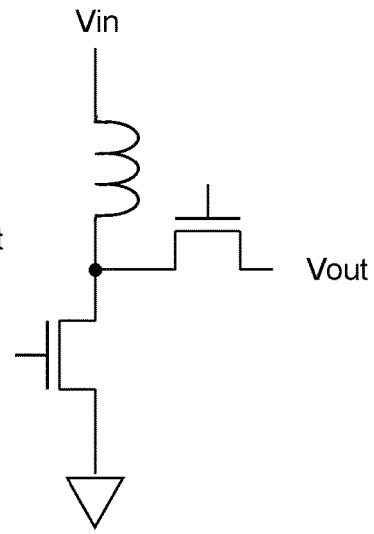
Figure 2D:
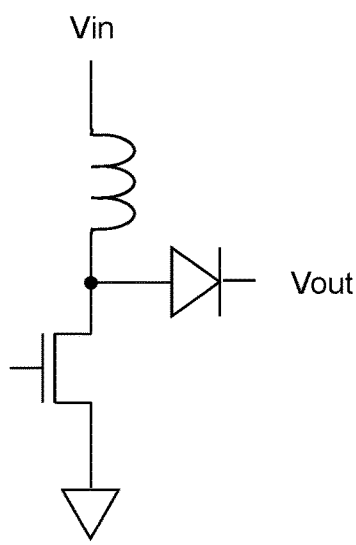
Figure 2E:
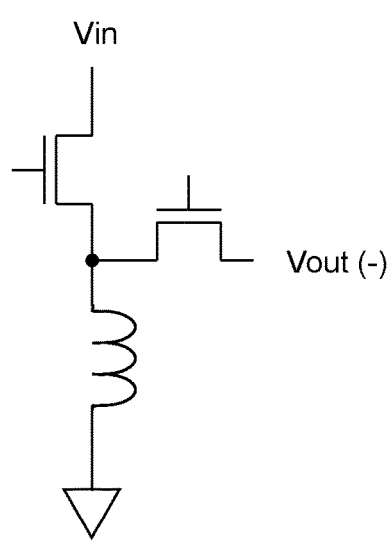
Figure 2F:
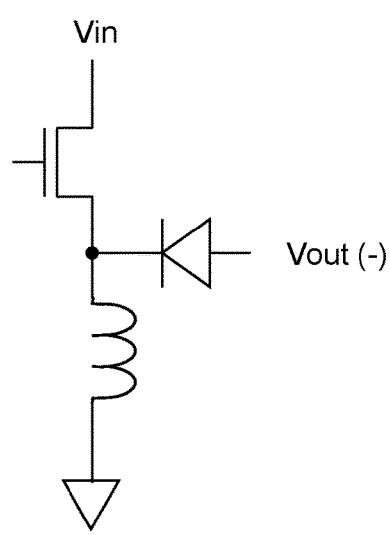
Figure 2G:
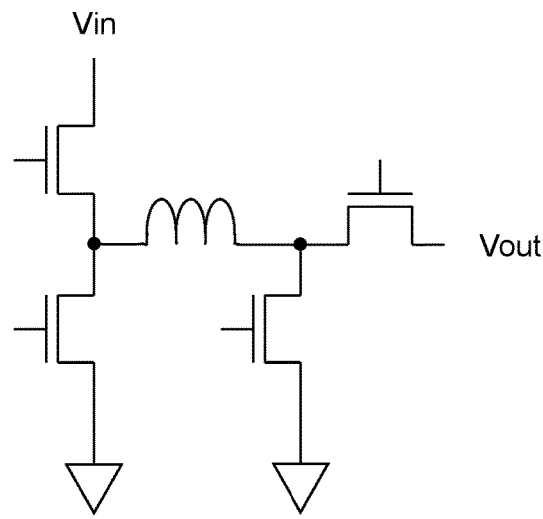
Figure 2H:
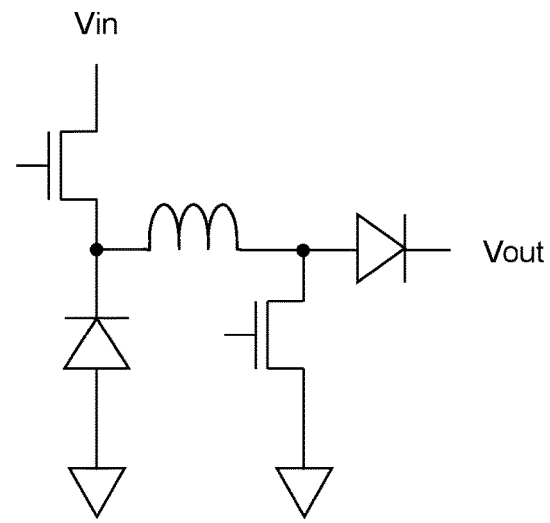
Figure 2I:
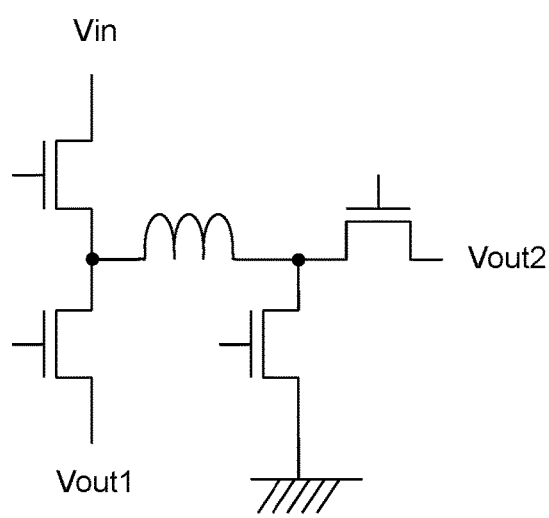
Figure 2J:
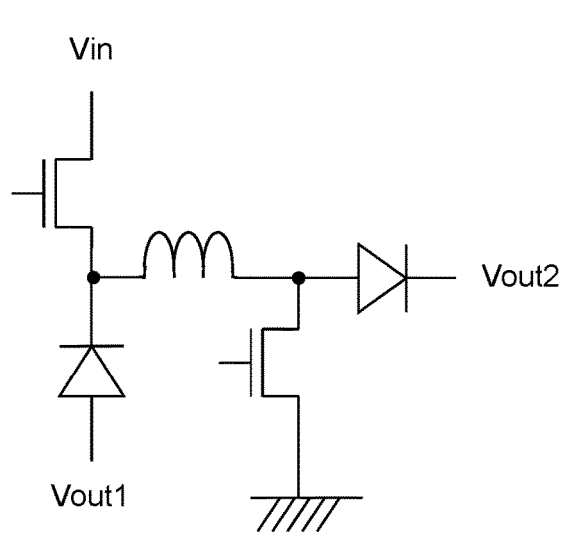
Figure 2K:
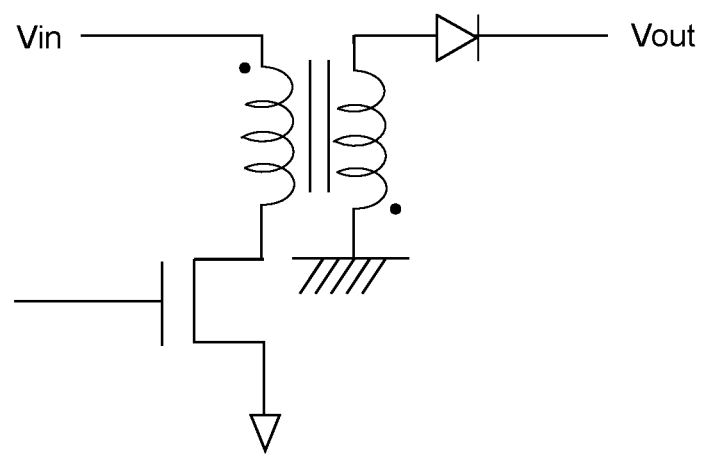

Please refer to FIG. 1, which is a circuit block diagram of a switching power conversion circuit 10 according to an embodiment of the present invention. As shown in FIG. 1, the switching power conversion circuit 10 includes a power stage circuit 100, a conversion control circuit 200 and a feedback circuit 300. The respective structures and functions of the power stage circuit 100, the conversion control circuit 200 and the feedback circuit 300 and their collaboration will be explained in detail below.

In some embodiments, the power stage circuit 100 is configured to convert an input power to an output power. In some embodiments, the input power includes an input voltage Vin and an input current Iin, and the output power includes an output current ILoad and an output voltage Vout. As shown in FIG. 1, the power stage circuit 100 includes a first power switch Q1, a second power switch Q2 and an inductor L coupled to a switching node LX. The two ends of the first power switch Q1 are respectively coupled to the input voltage Vin and the switching node LX; the two ends of the second power switch Q2 are respectively coupled to a ground potential and the switching node LX; and the two ends of the inductor L are respectively coupled to the output voltage Vout and the switching node LX. In some embodiments, the power stage circuit 100 is a buck converter, wherein the structure and function of the buck converter are well known to those skilled in the technical field to which the present invention pertains, and thus will not be described in detail herein.

Please refer to FIGS. 2A to 2K. FIGS. 2A to 2K are schematic circuit diagrams of power stage circuits according to some embodiments of the present invention. In some embodiments, the conversion control circuit 200 of the present invention can also be applied to other types of power stage circuits, for example but not limited to power stage circuits for boost conversion, buck conversion, buck-boost conversion, etc., as shown in FIGS. 2A to 2K. In some embodiments, the power stage circuit includes plural power switches, and in other embodiments, the power stage circuit includes a power switch and a switching device (e.g., a diode), for switching an inductor (or a winding of a transformer) of the power stage circuit.

In some embodiments, the conversion control circuit 200 is configured to generate and to control the power stage circuit 100 according to a feedback signal Vfb, thereby converting the input voltage Vin to the output voltage Vout. As shown in FIG. 1, the conversion control circuit 200 includes an error amplification circuit 210, a ramp signal generating circuit 220, and a pulse width modulation (PWM) circuit 250. In some embodiments, the PWM circuit 250 includes a modulation comparison circuit 230, an adjustable oscillation circuit 240 and a logic circuit 260. The structures and functions of the error amplification circuit 210, the ramp signal generating circuit 220 and the PWM circuit 250 and their collaboration will be explained in detail below.

Figure 3:
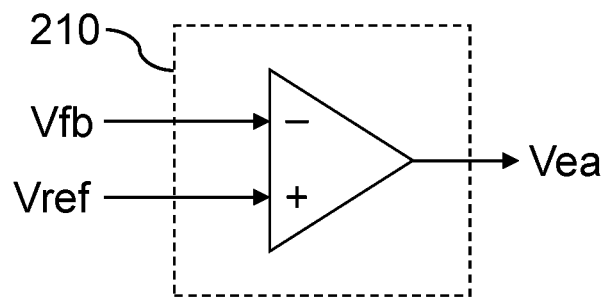
FIG. 3 is a schematic circuit diagram of an error amplification circuit according to an embodiment of the present invention.

Please refer to FIG. 3. FIG. 3 is a schematic circuit diagram of an error amplification circuit 210 according to an embodiment of the present invention, wherein the error amplification circuit 210 is configured to amplify the difference between a feedback signal Vfb and a reference signal Vref to generate an error amplified signal Vea. As shown in FIG. 3, in some embodiments, the error amplification circuit 210 includes an error amplifier. The non-inverting input end of the error amplifier receives the reference signal Vref; the inverting input end of the error amplifier receives the feedback signal Vfb, and the output end of the error amplifier outputs the error amplified signal Vea. The structure and function of an error amplifier are well known to those skilled in the technical field to which the present invention pertains, and thus will not be described in detail herein. In some embodiments, the feedback signal Vfb is relevant to the output voltage Vout. In some embodiments, the feedback signal Vfb is relevant to other electrical characteristics of the output power, such as the output current ILoad.

Figure 4:
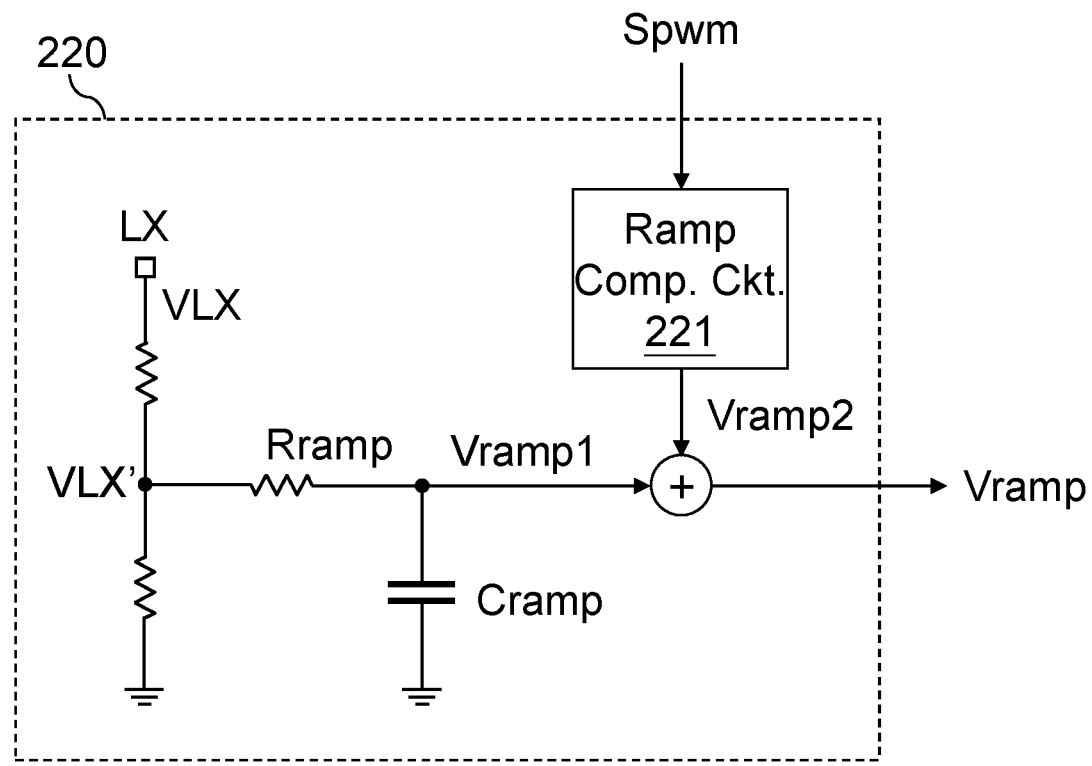
FIG. 4 is a schematic circuit diagram of a ramp signal generating circuit according to an embodiment of the present invention.

Please refer to FIG. 4. FIG. 4 is a schematic circuit diagram of a ramp signal generating circuit 220 according to an embodiment of the present invention, wherein the ramp signal generating circuit 220 is configured to generate a ramp signal Vramp. In some embodiments, the ramp signal Vramp is relevant to an inductor current IL flowing through the inductor L. As shown in FIG. 4, in some embodiments, the ramp signal generating circuit 220 divides the switching node voltage VLX on the switching node LX through plural resistors to generate the switching related voltage VLX', and the switching related voltage VLX' is filtered by a resistor Rramp and a capacitor Cramp to generate a ramp signal Vramp1 relevant to the inductor current IL. In some embodiments, at light load, the second power switch is turned off when the inductor current IL reaches 0, whereby the switching power conversion circuit 10 operates in discontinuous conduction mode or boundary conduction mode to improve conversion efficiency. In other words, in some embodiments, the inductor current IL is controlled to be greater than or equal to 0 and never negative. In some embodiments, the ramp signal Vramp is relevant to the PWM signal Spwm. As shown in FIG. 4, the ramp signal generating circuit 220 further includes a ramp compensation circuit 221, wherein the ramp compensation circuit 221 is configured to generate a ramp signal Vramp2 according to the PWM signal Spwm generated by the PWM circuit 250. The ramp signal generating circuit 220 adds the ramp signal Vramp1 relevant to the inductor current IL and the ramp signal Vramp2 generated by the ramp compensation circuit 221 to generate the ramp signal Vramp.

Figure 5:
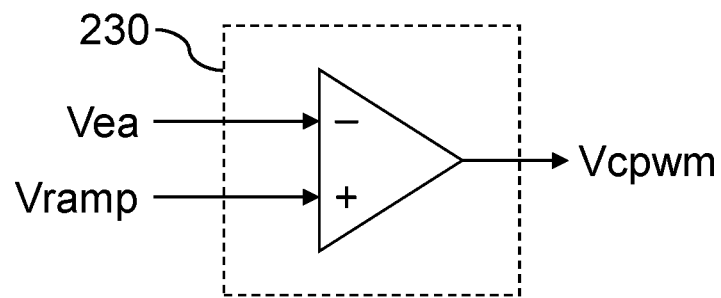
FIG. 5 is a schematic circuit diagram of a modulation comparison circuit according to an embodiment of the present invention.

Please refer to FIG. 5. FIG. 5 is a schematic circuit diagram of the modulation comparison circuit 230 according to an embodiment of the present invention, wherein the modulation comparison circuit 230 is configured to compare the error amplified signal Vea and the ramp signal Vramp to generate a modulation comparison signal Vcpwm. As shown in FIG. 5, in some embodiments, the modulation comparison circuit 230 is a comparator. The non-inverting input end of the comparator receive the ramp signal Vramp; the inverting input end of the comparator receives the error amplified signal Vea; and the output end of the comparator outputs the modulation comparison signal Vcpwm. The structure and function of the comparator are well known to those skilled in the technical field to which the present invention pertains, so detailed descriptions thereof are omitted. In one aspect, the modulation comparison signal Vcpwm indicates whether an electrical characteristic of the output power (e.g., output voltage Vout or output current Iout) reaches an output level or not.

Figure 6:
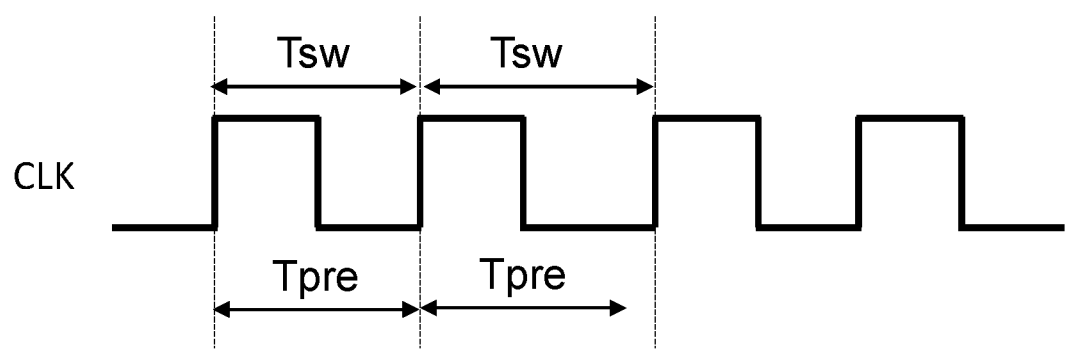
FIG. 6 is a schematic diagram of the waveform of a clock signal according to an embodiment of the present invention.

Please refer to FIG. 6, which is a schematic diagram of the waveform of the clock signal CLK according to an embodiment of the present invention. As shown in FIG. 6, in some embodiments, the adjustable oscillation circuit 240 is configured to generate a clock signal CLK according to the modulation comparison signal Vcpwm, wherein the clock signal CLK has a preset cycle period Tpre. According to the present invention, the present switching cycle period Tsw of the clock signal CLK can be adjusted according to the modulation comparison signal Vcpwm. The switching cycle period Tsw is, for example, the cycle period between the adjacent rising edges of the clock signal CLK. In some embodiments, the present switching cycle period of the clock signal CLK is greater than or equal to the preset cycle period Tpre, and the details of its generation and operation will be described in detail later.

Figure 7A:
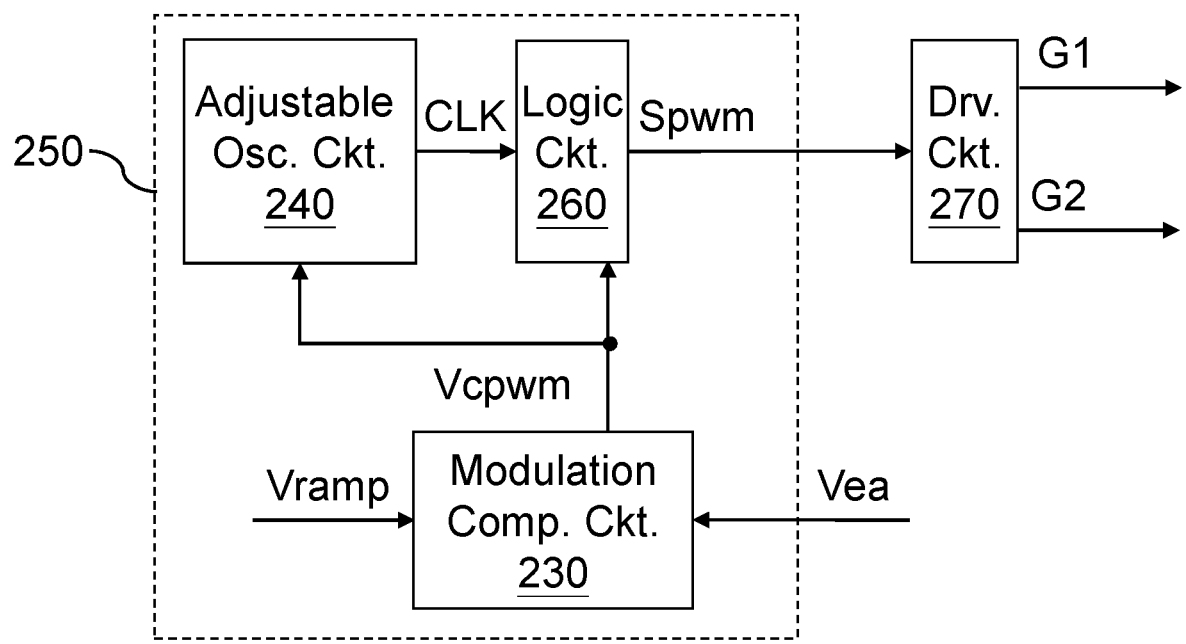
FIG. 7A is a schematic circuit diagram of a pulse width modulation (PWM) circuit according to an embodiment of the present invention.
Figure 7B:
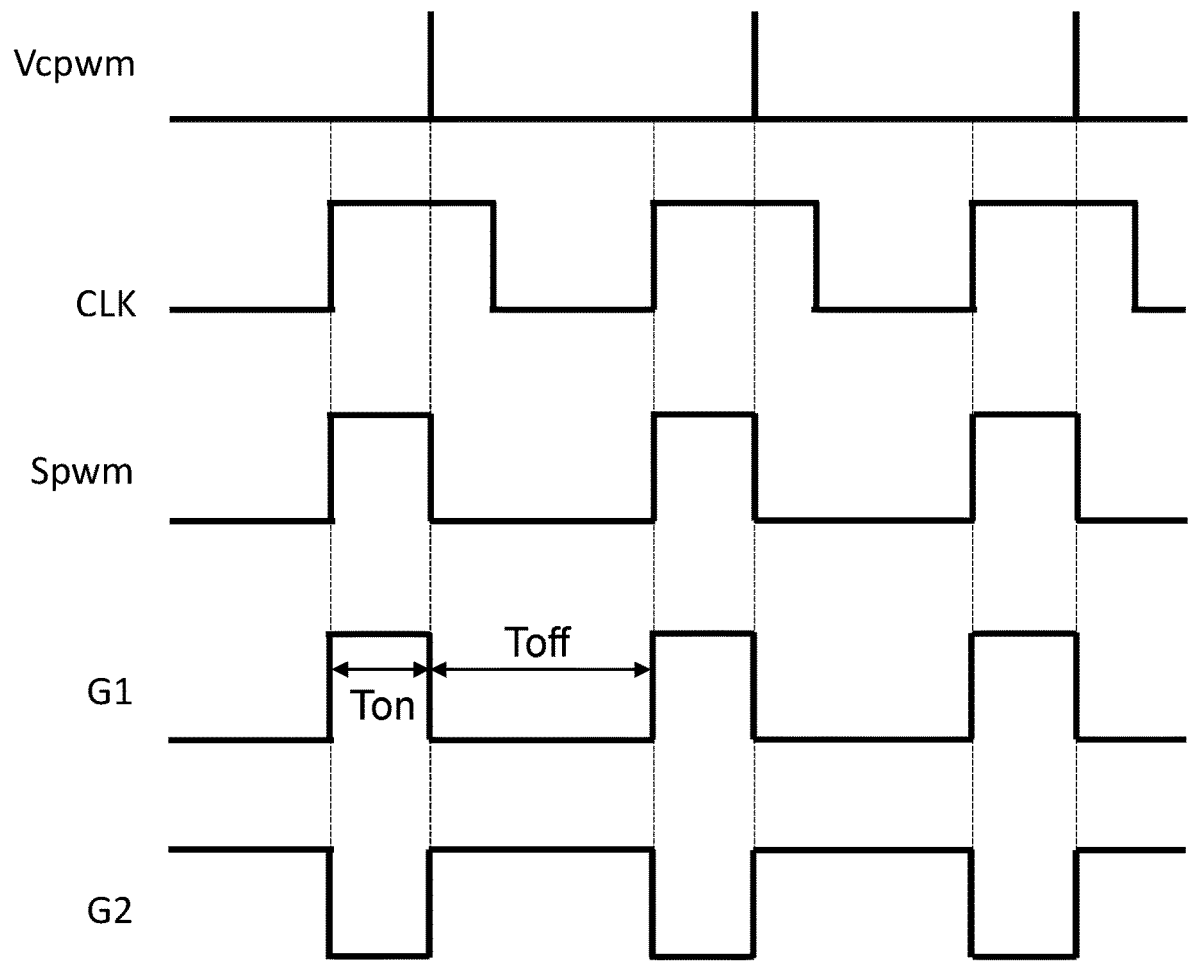
FIG. 7B is a schematic diagram of waveforms of the PWM signal and the control signal according to an embodiment of the present invention.

Please refer to FIG. 7A and FIG. 7B. FIG. 7A is a schematic circuit diagram of a PWM circuit 250 according to an embodiment of the present invention, wherein the PWM circuit 250 includes a modulation comparison circuit 230, an adjustable oscillator circuit 240, and a logic circuit 260. FIG. 7B is a schematic diagram of waveforms of the modulation comparison signal Vcpwm, the clock signal CLK, the PWM signal Spwm, and the control signals G1 and G2 according to an embodiment of the present invention. As shown in FIG. 7A, in some embodiments, the logic circuit 260 is configured to generate the PWM signal Spwm according to the modulation comparison signal Vcpwm and the clock signal CLK, wherein the first changing edge of the clock signal CLK (e.g., rising edge) triggers and enables the PWM signal Spwm, and the changing edge (e.g., rising edge) of the modulation comparison signal Vcpwm triggers and disables the PWM signal Spwm. In some embodiments, the conversion control circuit shown in FIG. 1 and FIG. 7A further includes a driving circuit 270 for generating plural control signals G1 and G2 according to the PWM signal Spwm, thereby controlling the first power switch Q1 and the second power switch Q2. As shown in FIG. 7B, in some embodiments, the PWM signal Spwm and the control signal G1 are in phase, and the PWM signal Spwm and the control signal G2 are in opposite phases, wherein the control signal G1 has an on-time Ton and an off-time Toff. In other words, when the PWM signal Spwm is at high level, the control signal G1 is at high level and the control signal G2 is at low level; when the PWM signal Spwm is at low level, the control signal G1 is at low level and the control signal G2 is at high level. In some embodiments, when the first changing edge (e.g., the rising edge) of the clock signal CLK enables the PWM signal Spwm, it means that the control signal G1 changes to high level, thereby triggering the first power switch Q1 to turn on; when the modulation comparison signal Vcpwm at high level disables the PWM signal Spwm, it means that the control signal G1 changes to low level, thereby triggering the first power switch Q1 to turn off.

Figure 8:
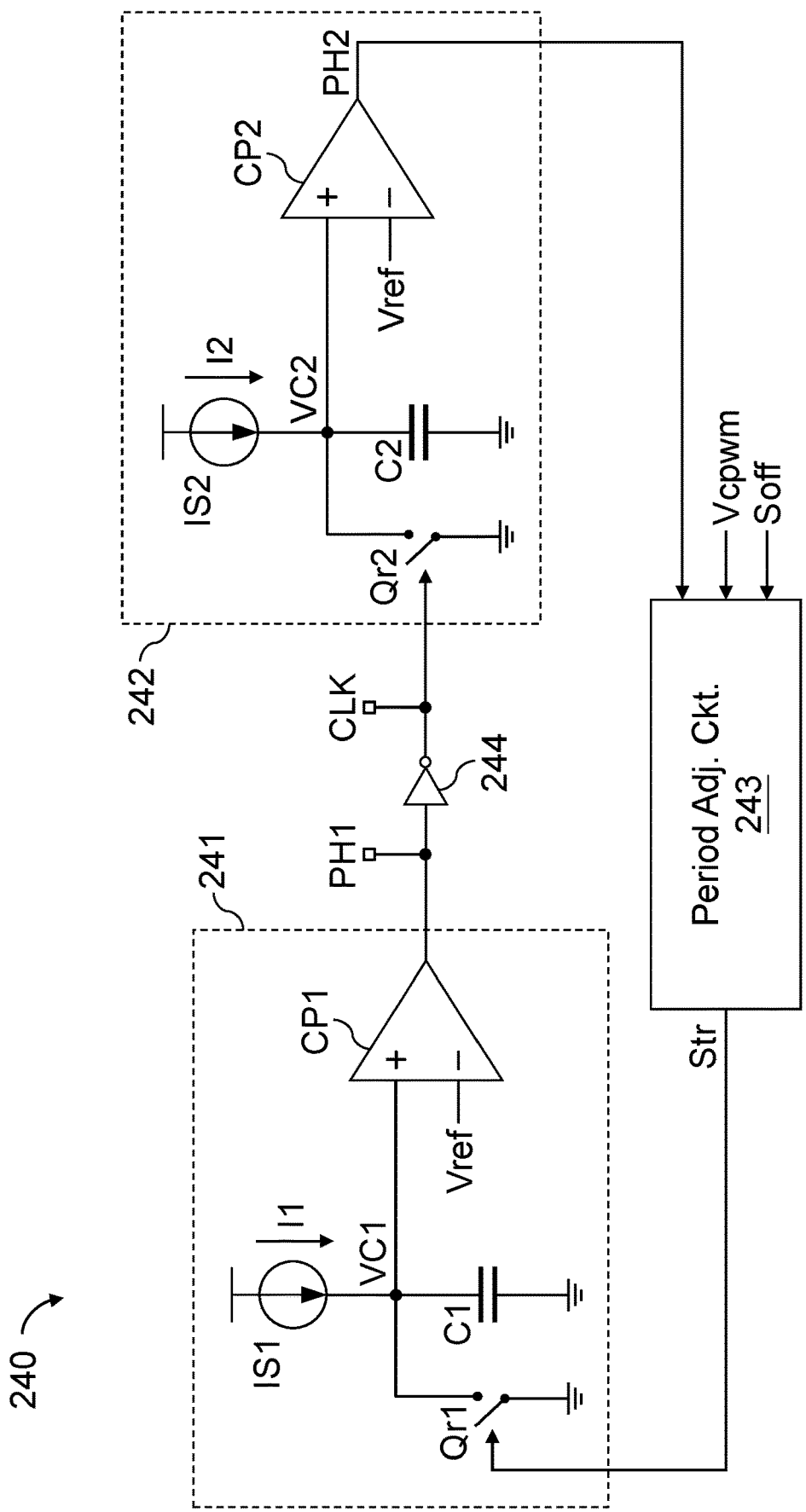
FIG. 8 is a schematic circuit diagram of an adjustable oscillation circuit according to an embodiment of the present invention.

Please refer to FIG. 8, which is a schematic circuit diagram of the adjustable oscillation circuit 240 according to an embodiment of the present invention. As shown in FIG. 8, in some embodiments, the adjustable oscillation circuit 240 includes a first timing circuit 241, a second timing circuit 242, and a cycle period adjustment circuit 243. The first timing circuit 241 is configured to generate a first phase signal PH1; the second timing circuit 242 is configured to generate a second phase signal PH2; and the cycle period adjustment circuit 243 is configured to generate a trigger signal Ster according to the second phase signal PH2, the modulation comparison signal Vcpwm, and a minimum turn-off trigger signal Soff, wherein when the minimum turn-off trigger signal Soff is enabled, it indicates that the off-time Toff has reached the preset minimum off-time Toffmin. In some embodiments, when the second phase signal PH2 is at high level, the modulation comparison signal Vcpwm is at low level, and the minimum turn-off trigger signal Soff is at high level (hereinafter referred to as the conditions for enabling the trigger signal Str), and the cycle period adjustment circuit 243 generates the trigger signal Str at high level.

As shown in FIG. 8, in some embodiments, the first timing circuit 241 includes a first current source IS1, a first capacitor C1, a first reset switch Qr1, and a first comparison circuit CP1. The first current source IS1 is configured to generate a first current I1. The first capacitor C1 is configured to generate a first integration voltage VC1 according to the integration of the first current I1. The first reset switch Qr1 resets the first integration voltage VC1 according to the trigger signal Str to start generating (integrating) the first integration voltage VC1 according to the integration of the first current I1. In a preferred embodiment, the trigger signal Str is a signal in pulse form. The first comparison circuit CP1 is configured to compare the first integration voltage VC1 with the reference signal Vref to generate the first phase signal PH1, wherein when the first integration voltage VC1 is higher than the reference signal Vref, the first phase signal PH1 is at high level, and when the first integration voltage VC1 is lower than the reference signal Vref, the first phase signal PH1 is at low level. In some embodiments, the time required for the first integration voltage VC1 to reach the level of the reference signal Vref from the reset of the first integration voltage VC1 is the preset first cycle period Tclk1, wherein the preset first cycle period Tclk1 is relevant to the first current I1, the capacitance of the first capacitor C1, and the reference signal Vref.

In some embodiments, the second timing circuit 242 includes a second current source IS2, a second capacitor C2, a second reset switch Qr2, and a second comparison circuit CP2. The second current source IS2 is configured to generate a second current I2. The second capacitor C2 is configured to generate a second integration voltage VC2 according to the integration of the second current I2. The second reset switch Qr2 is configured to reset the second integration voltage VC2 according to the clock signal CLK, wherein the clock signal CLK is relevant to the first phase signal PH1. The second comparison circuit CP2 is configured to compare the second integration voltage VC2 with the reference signal Vref to generate the second phase signal PH2, wherein when the second integration voltage VC2 is higher than the reference signal Vref, the second phase signal PH2 is at high level, and when the second integration voltage VC2 is lower than the reference signal Vref, the second phase signal PH2 is at low level. In some embodiments, the time required for the second integration voltage VC2 to reach the level of the reference signal Vref from the reset of the second integration voltage VC2 is a preset second cycle period Tclk2, wherein the preset second cycle period Tclk2 is relevant to the second currents I2, the capacitance value of the second capacitor C2, and the reference signal Vref.

In some embodiments, a NOT gate 244 is disposed between the first timing circuit 241 and the second timing circuit 242, wherein the NOT gate 244 receives the first phase signal PH1 to generate the clock signal CLK, so that the first phase signal PH1 and the clock signal CLK are in opposite phases to each other.

Figure 9:
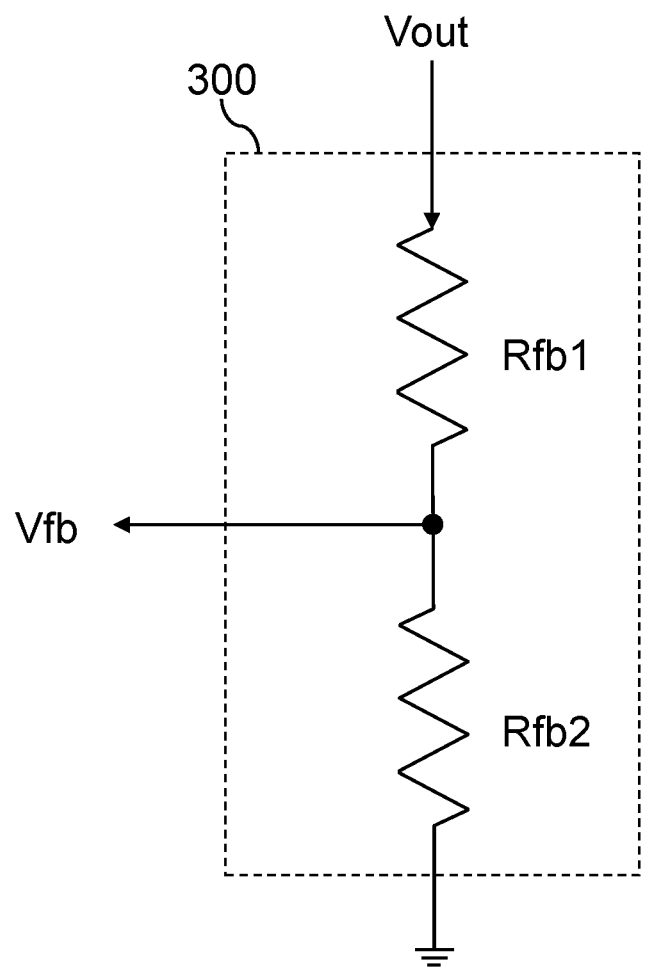
FIG. 9 is a schematic circuit diagram of a feedback circuit according to an embodiment of the present invention.

Please refer to FIG. 9, which is a schematic circuit diagram of the feedback circuit 300 according to an embodiment of the present invention. In some embodiments, the feedback circuit 300 is configured to generate the feedback signal Vfb according to the output voltage Vout, wherein there is a proportional relationship between the output voltage Vout and the feedback signal Vfb. In some embodiments, the feedback circuit 300 includes a voltage divider circuit formed by plural resistors, wherein the resistances of the resistors determine the proportional relationship. Taking FIG. 9 as an example, in the present embodiment, the feedback circuit 300 includes two resistors Rfb1, Rfb2, wherein the proportional relationship between the output voltage Vout and the feedback signal Vfb is determined by the resistance of the resistor Rfb1 and the resistance of the resistor Rfb2.

Figure 10A:
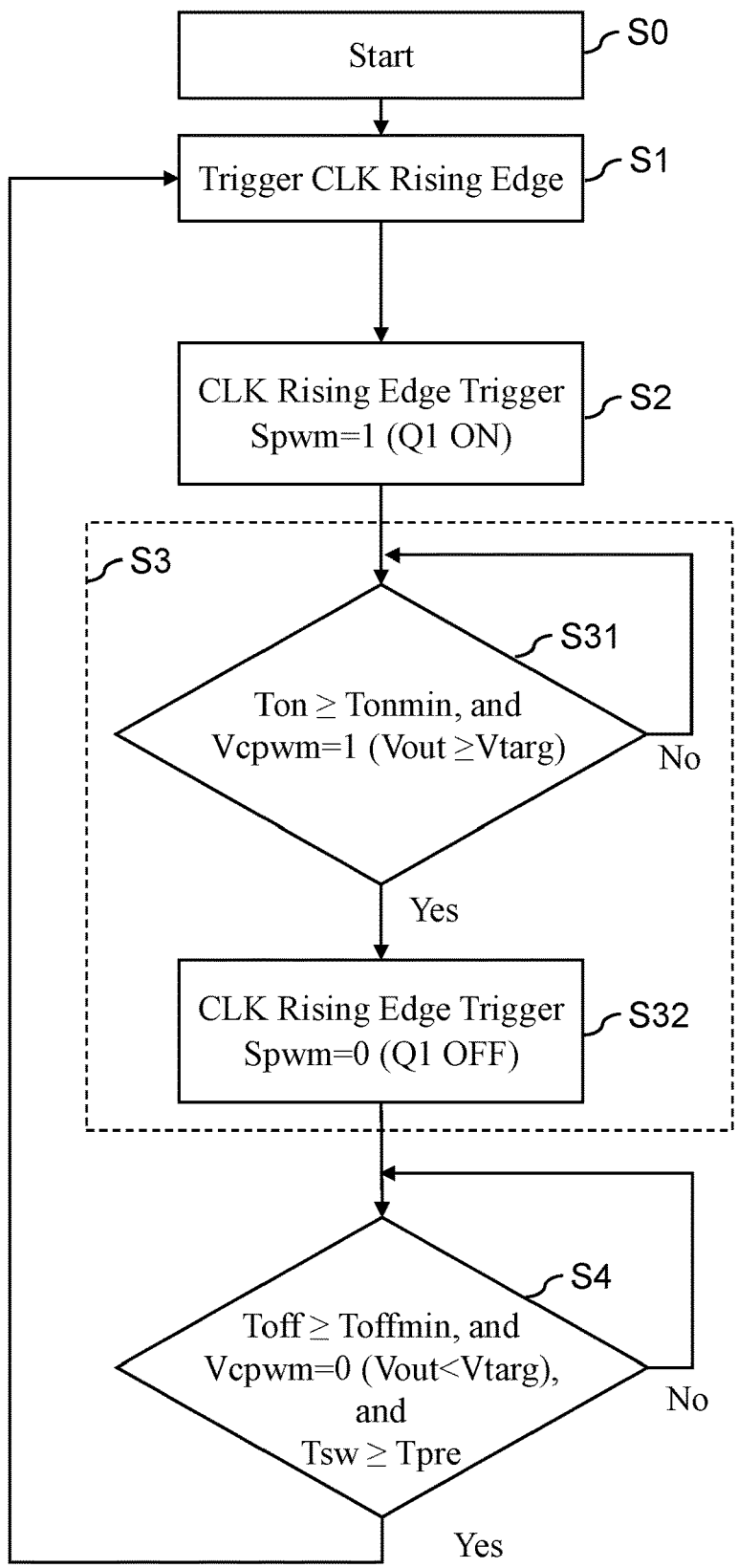
FIG. 10A is an operation flowchart (1) of the conversion control circuit according to an embodiment of the present invention.

Please refer to FIG. 10A. FIG. 10A is an operation flowchart (1) of the conversion control circuit 200 according to an embodiment of the present invention. As shown in FIG. 10A, when the conversion control circuit 200 starts operating, the PWM circuit 250 of the conversion control circuit 200 generates the PWM signal Spwm according to the following steps: In step S1, the adjustable oscillator circuit 240 triggers the clock signal CLK to generate a first changing edge (e.g., a rising edge, that is, switching to high level). It should be noted that, prior to the step S1, the step S0 can be, for example, a power on reset step, which triggers a first rising edge of the clock signal CLK. Subsequently, the logic circuit 260 enables the PWM signal Spwm according to the rising edge of the clock signal CLK to control the first power switch Q1 to be turned on (step S2). Subsequently, step S3 is performed, wherein step S3 includes step S31 and step S32. In step S31, the logic circuit 260 determines whether the on-time Ton of the first power switch Q1 reaches the preset minimum on-time Tonmin, and determines whether the modulation comparison signal Vcpwm indicates that the output voltage Vout reaches an output level. If not (at least one of the above conditions is not satisfied), the logic circuit 260 will wait (repeat step S31) until the above conditions are satisfied; when the determination in step S31 is yes (the above conditions are satisfied), the PWM signal Spwm is disabled to control the first power switch Q1 to be turned off (step S32).

Next, step S4 is performed: the adjustable oscillation circuit 240 determines (1) whether an off-time Toff starting from time point at which the PWM signal Spwm is turned off exceeds the preset minimum off-time Toffmin, and (2) determines whether the modulation comparison signal Vcpwm indicates that the output voltage Vout has not reached the output level (indicating that the first power switch Q1 needs to be turned on again), and (3) determines whether the present cycle period Tsw of the clock signal CLK has reached the preset cycle period Tpre or not. When the conditions of the step S4 are all satisfied, the procedure goes back to step S1, that is, controlling the adjustable oscillation circuit 240 to trigger the clock signal CLK again to generate the next rising edge, and repeating the steps.

It should be noted that the term "reach" such as in the condition "output voltage Vout reaches an output level" includes reaching or exceeding; in other words, "reach" indicates that the output voltage Vout is sufficient. On the other hand, the term "not reach" such as in the condition "output voltage Vout reaches an output level" indicates that the output voltage Vout is not enough. The same interpretation applies to the conditions related to "the present cycle period". In addition, the relationship between the output voltage Vout and the output level referred to herein can be an instant relationship or an average relationship, and the actual implementation mode can be selected according to different requirements.

Figure 10B:
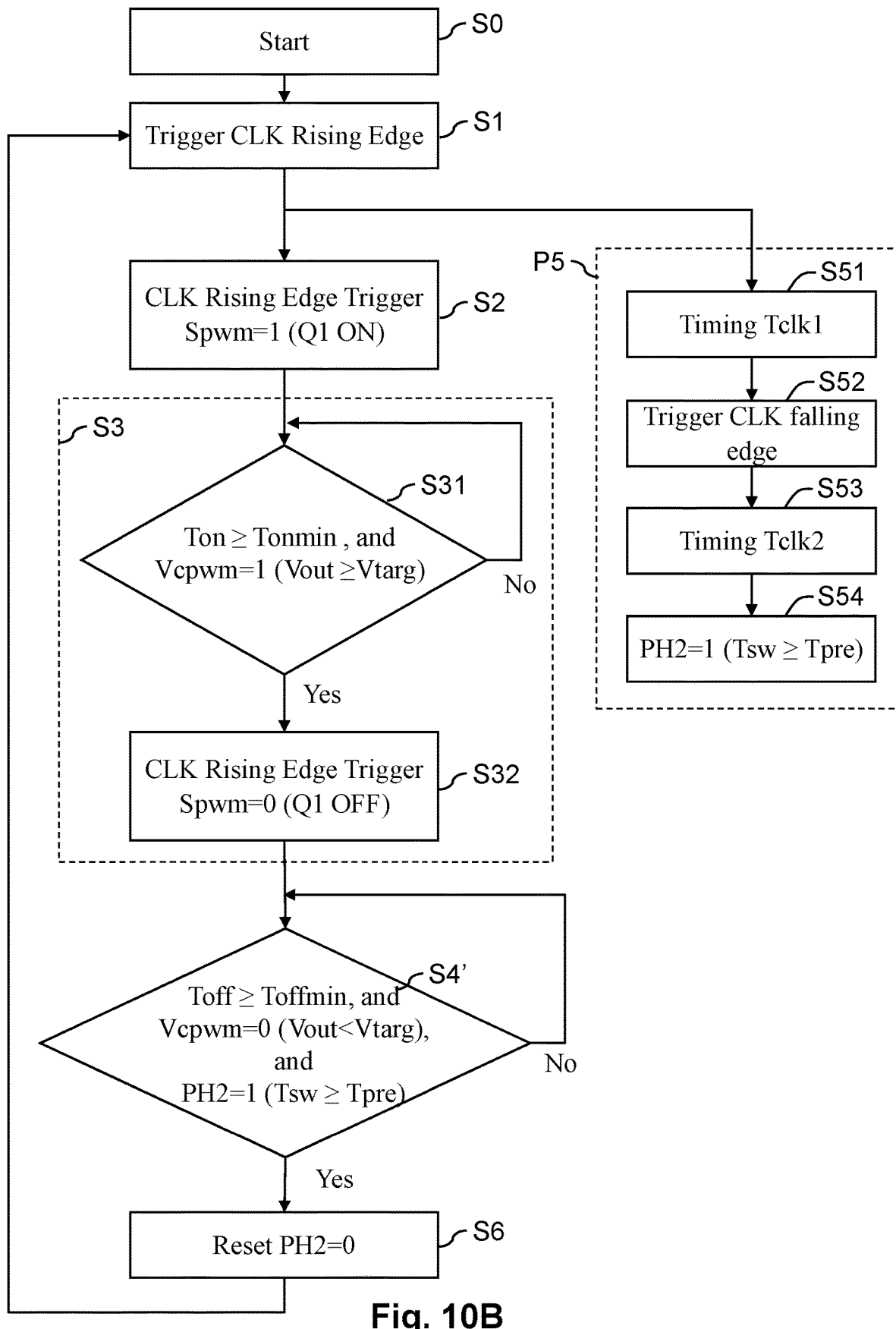
FIG. 10B is an operation flowchart (2) of the conversion control circuit according to an embodiment of the present invention.

Please refer to FIG. 10B. FIG. 10B is an operation flowchart (2) of the conversion control circuit 200 according to an embodiment of the present invention. The operation flowchart (2) of FIG. 10B is similar to the operation flowchart (1) of FIG. 10A. In one embodiment, as shown in FIG. 10B, the PWM circuit 250 further generates the PWM signal Spwm according to a timing procedure P5, wherein the timing procedure P5 includes: timing a preset first cycle period Tclk1 of the clock signal CLK after the clock signal changes to high level (step S51); subsequently, triggering a second changing edge of the clock signal CLK at time point when the preset first cycle period Tclk1 ends (e.g., falling edge, that is, turning to low level) (step S52); next, timing a preset second cycle period Tclk2 of the clock signals CLK after the clock signal CLK changes to low level (step S53), wherein a sum of the preset first cycle period Tclk1 and the preset second cycle period Tclk2 is the preset cycle period Tpre; and next enabling a second phase signal PH2 at the end of the preset second cycle period Tclk2, wherein the second phase signal PH2 indicates that the present cycle period Tsw has reached the preset cycle period Tpre (step S54).

In addition, in the operation flowchart (2) of FIG. 10B, in step S4', it is further determined whether the present cycle period Tsw has reached the preset cycle period Tpre according to the second phase signal PH2, and the procedure return to repeat step S1 only when all the conditions in step 4' are satisfied. In one embodiment, the second phase signal PH2 is enabled (e.g., high level) to indicate that the present cycle period Tsw has reached the preset cycle period Tpre. In one embodiment, the operation flowchart (2) of FIG. 10B further includes step S6. When step 4' is determined yes, the second phase signal PH2 is reset before the procedure return to repeat step S1.

Figure 10C:
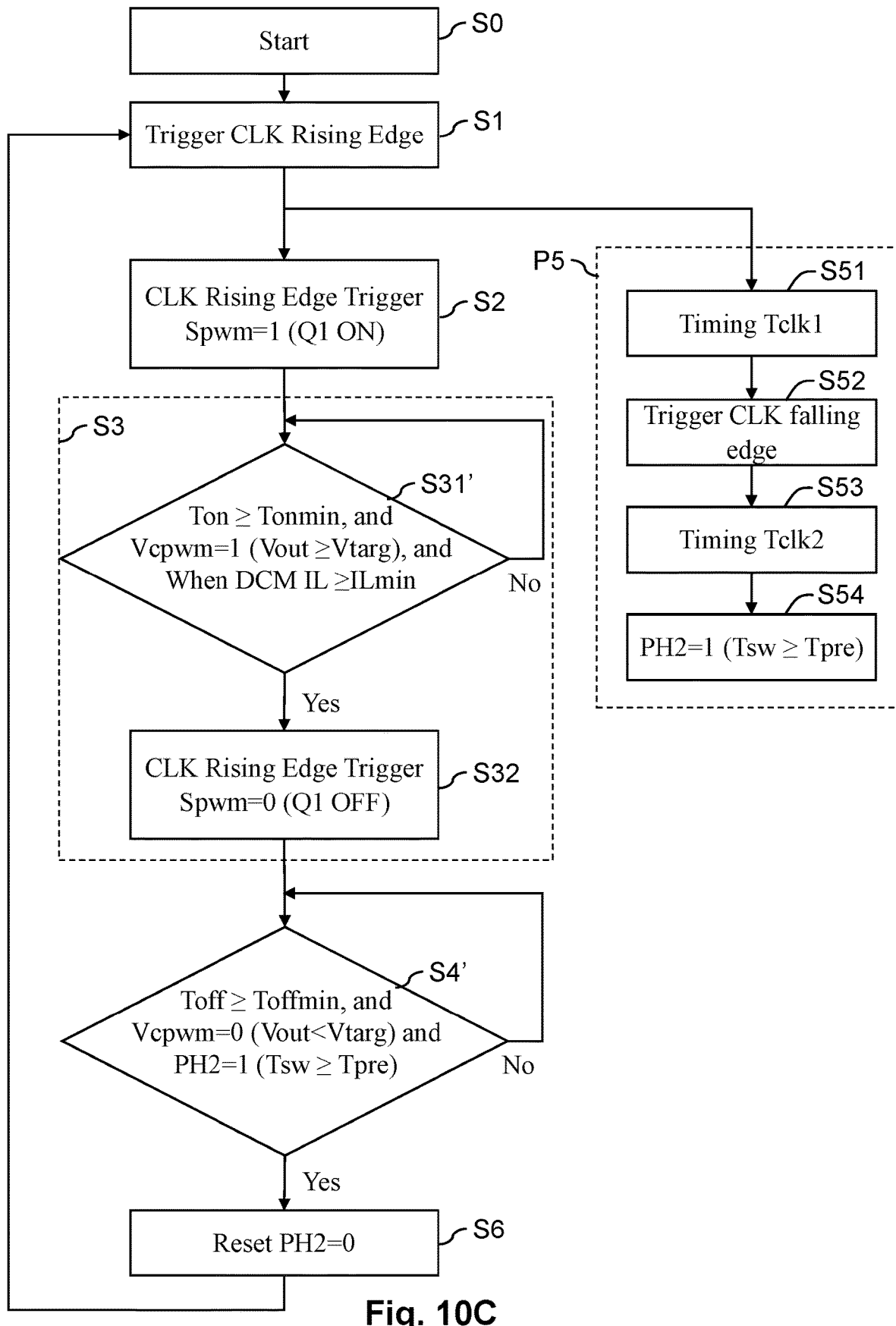
FIG. 10C is an operation flowchart (3) of the conversion control circuit according to an embodiment of the present invention.

Please refer to FIG. 10C. FIG. 10C is an operation flowchart (3) of the conversion control circuit 200 according to an embodiment of the present invention. The operation flowchart (3) of FIG. 10C is similar to the operation flowchart (2) of FIG. 10B. In the operation flowchart (3) of FIG. 10C, step S31' further includes: operating the power stage circuit 100 in a discontinuous conduction mode (DCM), and determining whether the inductor current IL exceeds a preset minimum current threshold THILmin. When all the conditions of step S31' are satisfied, step S32 is entered.

In some embodiments, the PWM circuit 250 disables the PWM signal Spwm and controls the first power switch Q1 to be turned off only when the modulation comparison signal Vcpwm indicates that the output voltage Vout reaches the output level, and after the first power switch Q1 is turned off, at least until the preset minimum off-time Toffmin passes, the step S1 is repeated to enable the clock signal CLK to generate the next first changing edge, so that when a sum of the on-time Ton and the preset minimum off-time Toffmin is greater than the preset cycle period Tpre, the present cycle period Tsw of the clock signal CLK is adaptively extended.

Figure 11A:
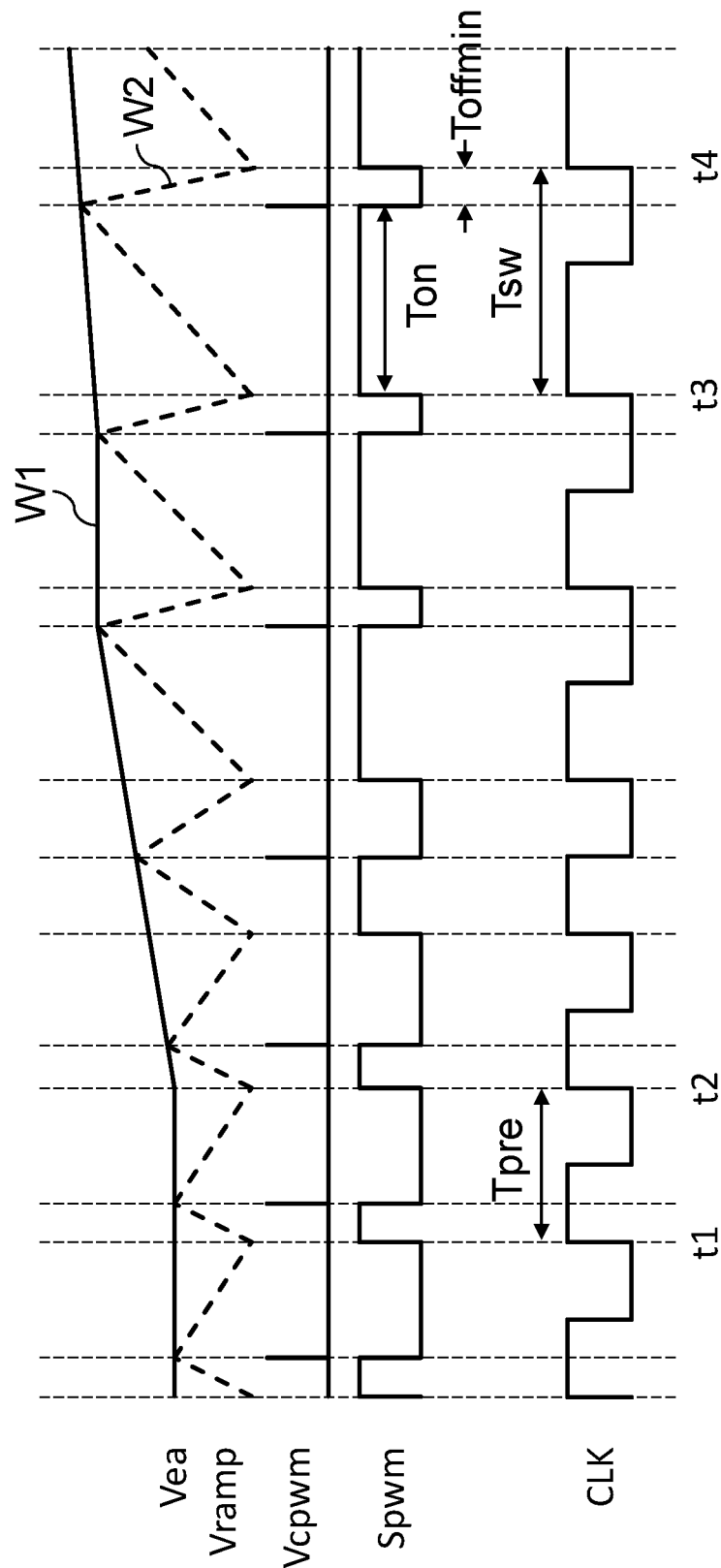
FIG. 11A is a schematic diagram (1) of signal waveforms of the conversion control circuit according to an embodiment of the present invention.

Please refer to FIG. 11A. FIG. 11A is a schematic diagram (1) of signal waveforms of the conversion control circuit 200 according to an embodiment of the present invention, wherein the solid line waveform W1 is the error amplified signal Vea, and the dotted line waveform W2 is the ramp signal Vramp. The conversion control circuit 200 controls the turn-on and turn-off of the first power switch Q1 through the aforementioned steps S1 to S6. As shown in FIG. 11A, when the conversion ratio of the output voltage Vout to the input voltage Vin does not cause the on-time Ton to be the preset minimum on-time Tonmin, nor cause the off-time Toff to be the preset minimum off-time Toffmin, the present cycle period Tsw of the pulse signal CLK is equal to the preset cycle period Tpre (as shown from time point t1 to time point t2). On the other hand, when the relationship between the output voltage Vout and the input voltage Vin changes and the conversion ratio increases, the feedback loop in the conversion control circuit 200 will lengthen the on-time Ton and shorten the off-time Toff in correspondence to the conversion ratio. When the required conversion ratio keeps increasing until the off-time Toff is shortened to the preset minimum off-time Toffmin, according to the aforementioned operations, the conversion control circuit 200 can extend the present cycle period Tsw of the clock signal CLK to be longer than the preset cycle period Tpre (as shown from time point t3 to time point t4). Thus, the on-time Ton is further extended to break through the upper limit of the conversion ratio corresponding to the preset cycle period Tpre and the preset minimum off-time Toffmin.

In some embodiments, the PWM circuit 250 repeats the step S1 to enable the clock signal CLK to generate the next first changing edge only when the modulation comparison signal Vcpwm indicates that the output voltage Vout does not reach the output level, so that when the sum of the off-time Toff and the preset minimum on-time Tonmin is greater than the preset cycle period Tpre, the present cycle period Tsw is adaptively extended.

Figure 11B:
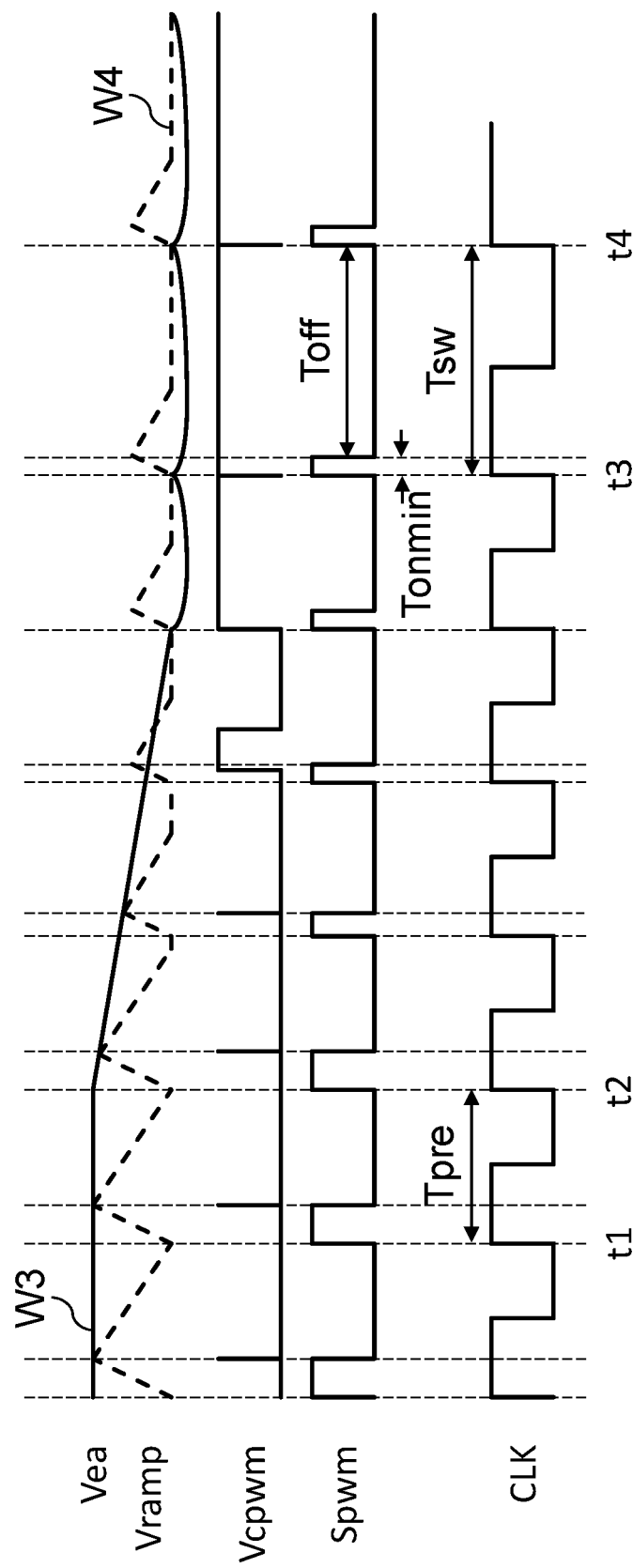
FIG. 11B is a schematic diagram (2) of signal waveforms of the conversion control circuit according to an embodiment of the present invention.

Please refer to FIG. 11B. FIG. 11B is a schematic diagram (2) of signal waveforms of the conversion control circuit 200 according to an embodiment of the present invention, wherein the solid line waveform W3 is the error amplified signal Vea, and the dotted line waveform W4 is the ramp signal Vramp. The conversion control circuit 200 controls the turn-on and turn-off of the first power switch Q1 through the aforementioned steps S1 to S6. As shown in FIG. 11B, in a preset cycle period Tpre of the clock signal CLK (as shown from time point t1 to time point t2), the conversion control circuit 200 controls the turn-on and turn-off of the first power switch Q1 through the aforementioned steps S1 to S6. When the conversion ratio of the output voltage Vout to the input voltage Vin does not cause the on-time Ton to be the preset minimum on-time Tonmin, nor cause the off-time Toff to be the preset minimum off-time Toffmin, the present cycle period Tsw of the clock signal CLK is equal to the preset cycle period Tpre (as shown from time point t1 to time point t2). On the other hand, when the relationship between the output voltage Vout and the input voltage Vin changes and the conversion ratio decreases, the feedback loop in the conversion control circuit 200 will reduce the on-time Ton and increase the off-time Toff in correspond to the conversion ratio. When the required conversion ratio keeps decreasing until the on-time Ton is shortened to the preset minimum on-time Tonmin, according to the aforementioned operation, the conversion control circuit 200 can extend the present cycle period Tsw of the clock signal CLK to make it longer than the preset cycle period Tpre (as shown from time point t3 to time point t4). Thus, the off-time Toff can be further extended to break through the lower limit of the conversion ratio corresponding to the preset cycle period Tpre and the preset minimum on-time Tonmin.

Figure 12A:
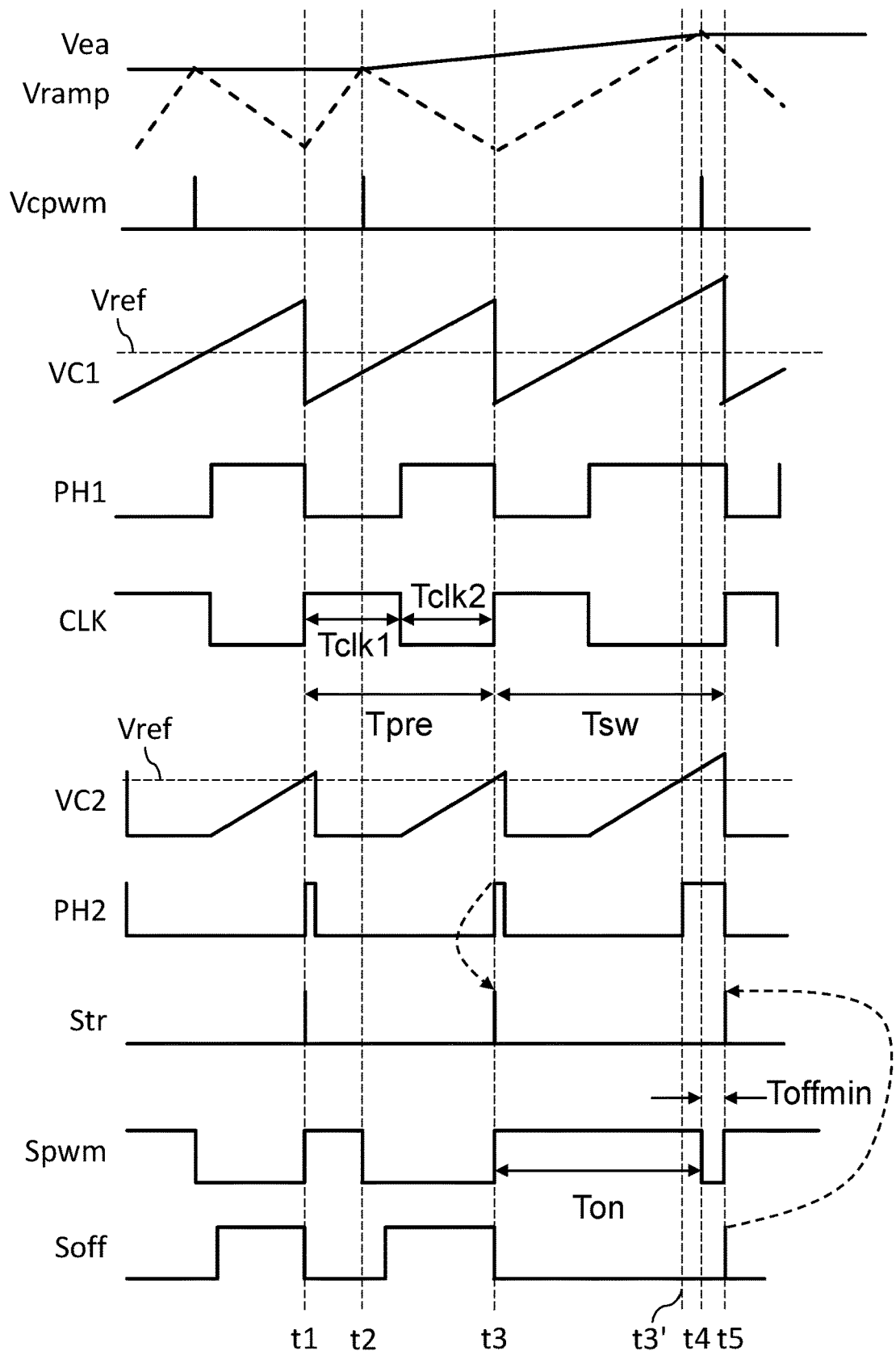
FIG. 12A is a schematic diagram (1) of signal waveforms of the adjustable oscillation circuit according to an embodiment of the present invention.

Please refer to FIG. 12A. FIG. 12A is a schematic diagram (1) of signal waveforms of the adjustable oscillation circuit 240 according to an embodiment of the present invention. FIG. 12A is an example illustrating how the adjustable oscillation circuit 240 extends the present cycle period Tsw of the clock signal CLK by the extension of the on-time Ton. As shown in FIG. 12A, at time point t1, the trigger signal Str is a pulse which resets the first integration voltage VC1 and the first integration voltage VC1 starts rising immediately after being reset; at the same time, since the first integration voltage VC1 is reset, the first phase signal PH1 changes to low level, whereby the clock signal CLK change to high level (corresponding to the rising edge of the clock signal CLK) to enable the PWM signal Spwm (turning to high level). During the rising period of the first integration voltage VC1 (as shown from time point t1 to time point t3), at time point t2, the modulation comparison signal Vcpwm is enabled to trigger the PWM signal Spwm to change to low level. In addition, when the first integration voltage VC1 rises higher than the reference signal Vref, the first phase signal PH1 changes to high level, so that the clock signal CLK changes to low level (that is, the falling edge, corresponding to the second changing edge), and whereby the second integration voltage VC2 stops its reset state and starts rising. At time t3, when the second integration voltage VC2 rises higher than the reference signal Vref, the second phase signal PH2 changes to high level; at this moment, since all the conditions for enabling the trigger signal Str are satisfied, the trigger signal Str changes to high level.

At time point t3, the trigger signal Str at high level again resets the first integration voltage VC1 and the first integration voltage VC1 starts rising immediately after being reset; at the same time, the reset of the first integration voltage VC1 causes the first phase signal PH1 to change to the low level, whereby the clock signal CLK is turned to high level (corresponding to the rising edge of the clock signal CLK) to enable the PWM signal Spwm. During the rising period of the first integration voltage VC1 (as shown from time point t3 to time point t5), because the output voltage Vout is insufficient, the modulation comparison signal Vcpwm is at low level. Hence, the on-time Ton of the PWM signal Spwm is kept being extended, and the modulation comparison signal Vcpwm is not enabled until time point t4, at which time point the PWM signal Spwm is triggered to change to low level. It should be noted that, between time point t4 and time point t5, when the off-time Toff of the PWM signal Spwm reaches the preset minimum off-time Toffmin, since the minimum turn-off trigger signal Soff is enabled, all the conditions for enabling the trigger signal Str are satisfied, the trigger signal Str changes to high level, thereby enabling the PWM signal Spwm again. The operation process of enabling the PWM signal Spwm is the same as described previously, so the details thereof are not repeated here.

It is worth noting that, in the present embodiment, at time point t3', although the second phase signal PH2 has changed to high level, the conditions for enabling the trigger signal Str are not all satisfied (the modulation comparison signal Vcpwm is still at low level, indicating that the output voltage Vout is insufficient), thus, the on-time Ton is kept being extended, and the trigger signal Str is also delayed so that the present cycle period Tsw of the clock signal CLK from time point t3 to time point t5 is also extended to meet the increase of the conversion ratio.

Figure 12B:
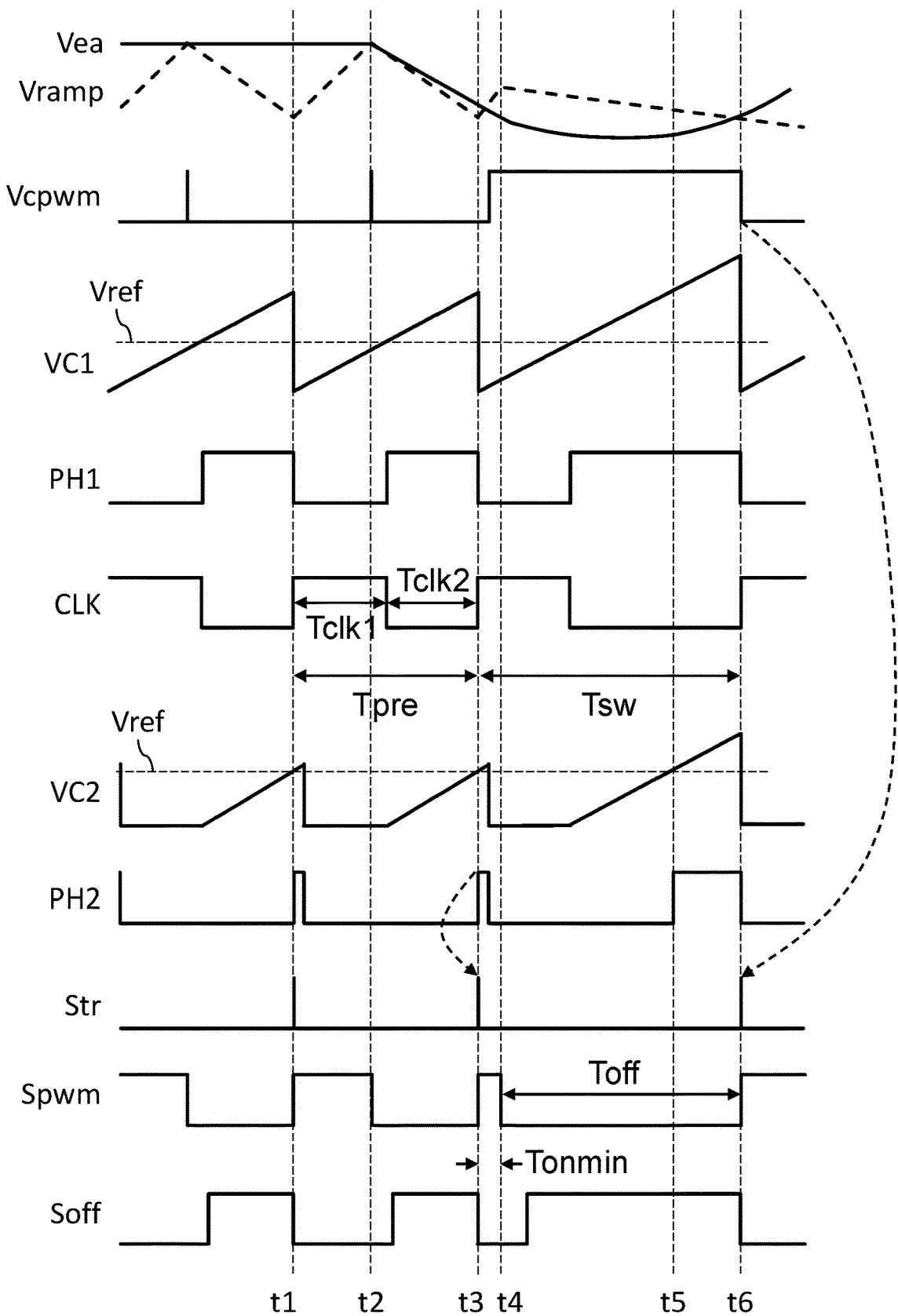
FIG. 12B is a schematic diagram (2) of signal waveforms of the adjustable oscillation circuit according to an embodiment of the present invention.

Please refer to FIG. 12B. FIG. 12B is a schematic diagram (2) of signal waveforms of the adjustable oscillation circuit 240 according to an embodiment of the present invention. FIG. 12B is an example illustrating how the adjustable oscillation circuit 240 extends the present cycle period Tsw of the clock signal CLK to extend the off-time Toff. In FIG. 12A, the operation of the present cycle period Tsw of the clock signal CLK from time point t1 to time point t3 is the same as that of FIG. 12A, so the details thereof are not repeated here and please refer to the description of FIG. 12A.

At time point t3, the trigger signal Str at high level again resets the first integration voltage VC1 and the first integration voltage VC1 starts rising immediately after being reset; at the same time, the reset of the first integration voltage VC1 causes the first phase signal PH1 to change to the low level, whereby the clock signal CLK is turned to high level (corresponding to the rising edge of the clock signal CLK) to enable the PWM signal Spwm. During the rising period of the first integration voltage VC1 (as shown from time point t3 to time point t5), between time point t3 and time point t4, even if the modulation comparison signal Vcpwm is still in the enabled state, since the on-time Ton of the PWM signal Spwm has not yet reached the preset minimum on-time Tonmin, the PWM signal Spwm is not triggered until time point t4, at which time point it changes to low level (because the on-time Ton has reached the preset minimum on-time Tonmin). Between time point t4 and time point t5, because the output voltage Vout is still too high, the modulation comparison signal Vcpwm is at high level. In this case, the off-time Toff of the PWM signal Spwm is kept being extended until time point t6, and at time point t6, when the modulation comparison signal Vcpwm changes to low level, all the conditions for enabling the trigger signal Str are satisfied, so the trigger signal Str changes to high level, whereby the PWM signal Spwm is enabled again, wherein the operation process of enabling the PWM signal Spwm is the same as described previously, so the details thereof are not repeated here.

It should be noted that, in the present embodiment, at time point t5, although the second phase signal PH2 has changed to high level, the conditions for enabling the trigger signal Str are not all satisfied (the modulation comparison signal Vcpwm is still at high level, indicating that the output voltage Vout is too high), so the trigger signal Str is delayed, so that the present cycle period Tsw of the clock signal CLK is extended (from time point t3 to time point t6). As such, the off-time Toff can be kept being extended to meet the reduction of the conversion ratio.

In some embodiments, the PWM circuit 250 controls the first power switch Q1 according to the following steps: determining whether the inductor current IL reaches 0 before the first power switch Q1 is turned on; and if yes (indicating operating in discontinuous conduction mode), after the first power switch Q1 is turned on, when the on-time Ton exceeds the preset minimum on-time Tonmin, the modulation comparison signal Vcpwm indicates that the output voltage Vout reaches the output level, and when the inductor current IL reaches a preset minimum current threshold THILmin, the first power switch Q1 is turned off.

Figure 13:
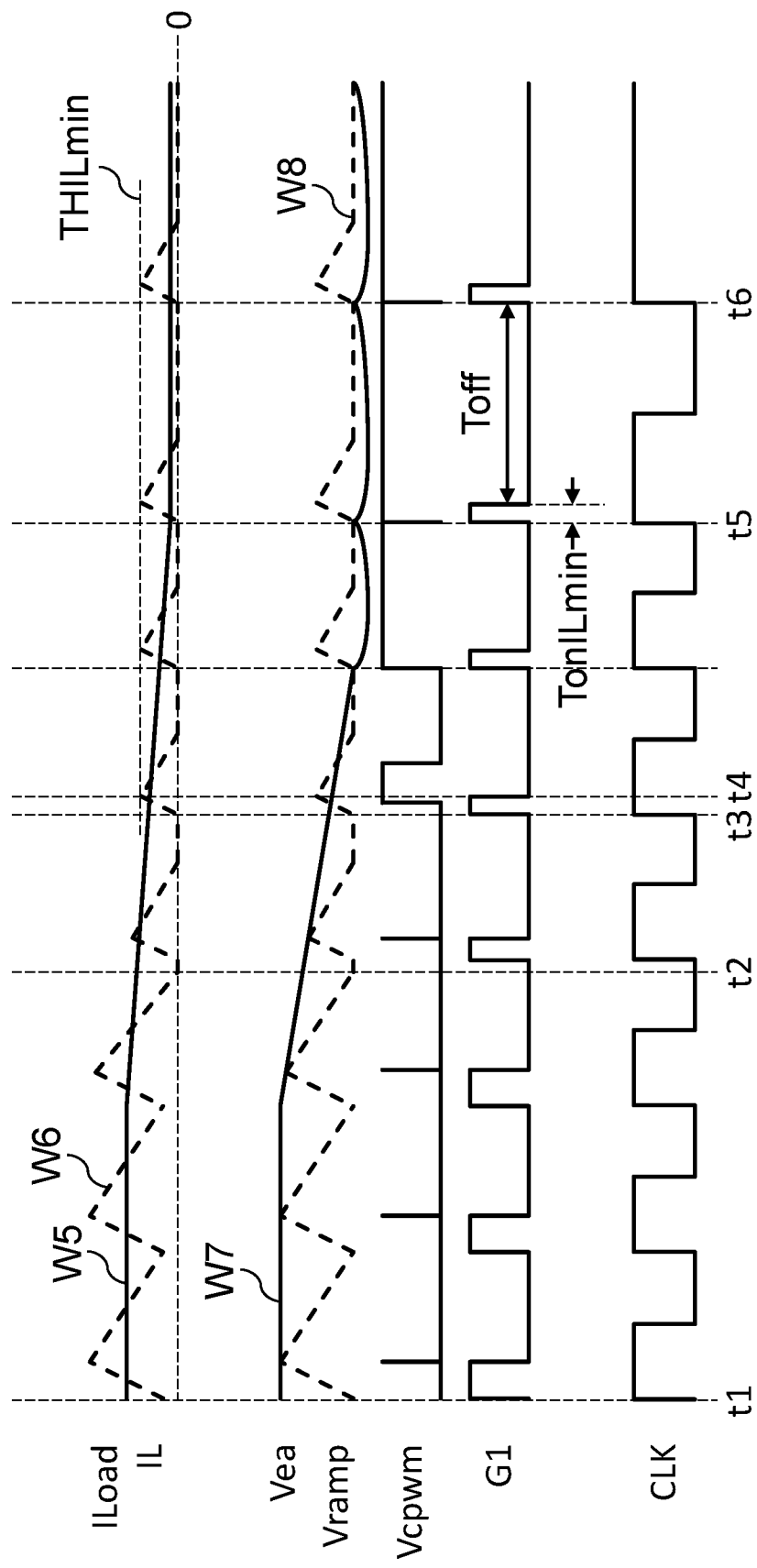
FIG. 13 is a schematic diagram (3) of signal waveforms of the conversion control circuit according to another embodiment of the present invention.

Please refer to FIG. 13. FIG. 13 is a schematic diagram (3) of signal waveforms of the conversion control circuit 200 according to another embodiment of the present invention, which corresponds to the operation flowchart (3) of FIG. 10C. The solid line waveform W5 is an output current ILoad flowing through an external load LD; the dotted line waveform W6 is the inductor current IL; the solid line waveform W7 is the error amplified signal Vea; and the dotted line waveform W8 is the ramp signal Vramp. As shown in FIG. 13, between time point t1 and time point t2, since the inductor current IL has not yet reached 0, the conversion control circuit 200 operates as above-mentioned to control the turn-on and turn-off of the first power switch Q1. At time t2, when operating in the discontinuous conduction mode, the PWM circuit 250 starts using the inductor current IL as one of the turn-off conditions of the first power switch Q1. For example, after the first power switch Q1 is turned on (as indicated by time point t3), when the on-time Ton exceeds the preset minimum on-time Tonmin, the modulation comparison signal Vcpwm indicates that the value of the output voltage Vout reaches the output level, and when the inductor current IL rises to reach a preset minimum current threshold THILmin, the PWM circuit 250 turns off the first power switch Q1 (as indicated by time point t4), wherein the on-time required for the inductor current IL to rise to reach a preset minimum current threshold THILmin is the minimum current on-time TonILmin. In some embodiments, the on-time corresponding to the inductor current IL reaching the preset minimum current threshold THILmin (minimum current on-time TonILmin) is greater than or equal to the preset minimum on-time. It should be noted that, as shown from time point t5 to time point t6 in FIG. 13, under the premise that an inductor current IL having a level corresponding to the preset minimum current threshold THILmin is provided at each turn-on, when the output current ILoad required by the external load LD is extremely light, the PWM circuit 250 according to the present invention can still reduce the switching frequency of the clock signal CLK by extending the off-time Toff of the PWM signal Spwm, so as to reduce the switching loss, thereby improving the conversion efficiency.

To sum up, the conversion control circuit of the present invention can adaptively extend the cycle period of the clock signal, so that the on-time or off-time of the PWM signal can be extended, whereby the conversion ratio of the output voltage to the input voltage of the power stage circuit can be even closer to 0 or closer to 1, so as to expand the range of the output voltage and/or the input voltage.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A conversion control circuit configured to control a power stage circuit, wherein the power stage circuit comprises a power switch, a switching device and an inductor which are coupled to one another, the power switch and the switching device are configured to switch the inductor to convert an input power to generate an output power, wherein the conversion control circuit comprises:
   an error amplification circuit, configured to generate an error amplified signal according to a feedback signal relevant to the output power and a reference signal;
   a ramp signal generating circuit, configured to generate a ramp signal; and
   a pulse width modulation (PWM) circuit, configured to generate a PWM signal according to the error amplified signal and the ramp signal, wherein the power switch is switched according to the PWM signal;
   the PWM circuit comprising:
      a modulation comparison circuit, configured to compare the error amplified signal and the ramp signal to generate a modulation comparison signal;
      an adjustable oscillation circuit, configured to generate a clock signal according to the modulation comparison signal, wherein the clock signal is adjustable and has a preset cycle period; and
      a logic circuit, configured to generate the PWM signal according to the modulation comparison signal and the clock signal;
   wherein the PWM circuit generates the PWM signal according to following steps:
   S1: triggering the clock signal to generate a first changing edge;
   S2: enabling the PWM signal at the first changing edge to control the power switch to be turned on;
   S3: when an on-time after the PWM signal is enabled exceeds a preset minimum on-time, and when the modulation comparison signal indicates that an electrical characteristic of the output power reaches an output level, disabling the PWM signal to control the power switch to be turned off; and
   S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

2. The conversion control circuit of claim 1, wherein the PWM circuit disables the PWM signal only when the modulation comparison signal indicates that the electrical characteristic of the output power reaches the output level, and after the PWM signal is disabled, the PWM signal is maintained disabled for at least the preset minimum off-time, and thereafter the step S1 is repeated, so that when a sum of the on-time and the preset minimum off-time is greater than the preset cycle period, the present cycle period of the clock signal is adaptively extended, whereby a ratio of the on-time to the present cycle period corresponds to a conversion ratio of an output voltage of the output power to an input voltage of the input power;

wherein the PWM circuit repeats the step S1 when the modulation comparison signal indicates that the electrical characteristic of the output power does not reach the output level, so that when a sum the off-time and the preset minimum on-time is greater than the preset cycle period, the present cycle period is adaptively extended, whereby the ratio of the on-time to the present cycle period corresponds to the conversion ratio.

3. The conversion control circuit of claim 1, wherein an inductor current flowing through the inductor is greater than or equal to zero.

4. The conversion control circuit of claim 3, wherein the step S3 further comprises:

when the power stage circuit operates in a discontinuous conduction mode (DCM), the PWM signal is disabled only when the inductor current is determined to exceed a preset minimum current threshold.

5. The conversion control circuit of claim 4, wherein the on-time corresponding to the inductor current reaching the preset minimum current threshold is greater than or equal to the preset minimum on-time.

6. The conversion control circuit of claim 1, wherein the step S1 further comprises controlling the clock signal to change to a first state at the first changing edge, wherein the PWM circuit further generates the clock signal according to a timing procedure, wherein the timing procedure comprises:

S51: timing a preset first cycle period of the clock signal after the clock signal changes to the first state;

S52: triggering a second changing edge of the clock signal at an end of the preset first cycle period to control the clock signal to change to a second state;

S53: timing a preset second cycle period of the clock signal after the clock signal changes to the second state, wherein a sum of the preset first cycle period and the preset second cycle period is the preset cycle period; and S54: enabling a timing signal at an end of the preset second cycle period, wherein the timing signal indicates that the present cycle period has reached the preset cycle period;

wherein the step S4 further comprises:

repeating the step S1 only after the timing signal determines that the present cycle period has reached the preset cycle period.

7. The conversion control circuit of claim 6, wherein the adjustable oscillation circuit comprises:

a first timing circuit, configured to time the preset first cycle period according to a trigger signal, and to generate a first phase signal accordingly, wherein the first phase signal indicates the preset first cycle period, and the clock signal is relevant to the first phase signal;

a second timing circuit, configured to start timing the preset second cycle period of the clock signal from the end of the preset first cycle period and to generate a second phase signal accordingly, wherein the second phase signal indicates the preset second cycle period, wherein the second phase signal is or corresponds to the timing signal; and a cycle period adjustment circuit, configured to control the clock signal to maintain at the second state until the off-time exceeds the preset minimum off-time after the second phase signal indicates that the preset second cycle period has expired, and to trigger the trigger signal when the modulation comparison signal indicates that the electrical characteristic of the output power does not reach the output level.

8. The conversion control circuit of claim 7, wherein the first timing circuit comprises:

a first current source, configured to generate a first current;

a first capacitor, configured to generate a first integration voltage according to an integration of the first current;

a first reset switch, configured to reset the first integration voltage according to the trigger signal; and a first comparison circuit, configured to compare the first integration voltage with the reference signal to generate the first phase signal;

wherein the second timing circuit comprises:

a second current source, configured to generate a second current;

a second capacitor, configured to generate a second integration voltage according to an integration of the second current;

a second reset switch, configured to reset the second integration voltage according to the first phase signal indicated to timing the preset first cycle period; and a second comparison circuit, configured to compare the second integration voltage with the reference signal to generate the second phase signal.

9. The conversion control circuit of claim 1, wherein the ramp signal is relevant to an inductor current flowing through the inductor.

10. The conversion control circuit of claim 1, wherein the ramp signal is relevant to the PWM signal.

11. A switching power conversion circuit, comprising:

a power stage circuit, configured to convert an input power to an output power, wherein the power stage circuit comprises a power switch, a switching device and an inductor coupled to one another;

a conversion control circuit configured to control the power stage circuit according to a feedback signal, thereby converting the input power to the output power; and a feedback circuit, configured to generate the feedback signal according to the output power, wherein the conversion control circuit comprises:

an error amplification circuit, configured to generate an error amplified signal according to a feedback signal relevant to the output power and a reference signal;

a ramp signal generating circuit, configured to generate a ramp signal; and a pulse width modulation (PWM) circuit, configured to generate a PWM signal according to the error amplified signal and the ramp signal, wherein the power switch is switched according to the PWM signal;

the PWM circuit comprising:

a modulation comparison circuit, configured to compare the error amplified signal and the ramp signal to generate a modulation comparison signal;

an adjustable oscillation circuit, configured to generate a clock signal according to the modulation comparison signal, wherein the clock signal is adjustable and has a preset cycle period; and a logic circuit, configured to generate the PWM signal according to the modulation comparison signal and the clock signal;

wherein the PWM circuit generates the PWM signal according to following steps:

S1: triggering the clock signal to generate a first changing edge;

S2: enabling the PWM signal at the first changing edge to control the power switch to be turned on;

S3: when an on-time after the PWM signal is enabled exceeds a preset minimum on-time, and when the modulation comparison signal indicates that an electrical characteristic of the output power reaches an output level, disabling the PWM signal to control the power switch to be turned off; and S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

12. A method for controlling a switching power conversion circuit, the switching power conversion circuit comprising: a power switch, a switching device and an inductor coupled to one another, the power switch and the switching device used to switch the inductor to convert an input power to generate an output power, the method comprising:

generating a modulation comparison signal according to a feedback signal, wherein the modulation comparison signal indicates whether an electrical characteristic of the output power reaches an output level;

generating a clock signal, wherein the clock signal is adjustable and has a preset cycle period; and generating a PWM signal according to the modulation comparison signal and the clock signal for controlling the power switch;

wherein the step of generating the PWM signal comprises:

S1: triggering the clock signal to generate a first changing edge;

S2: enabling the PWM signal at the first changing edge to control the power switch to be turned on;

S3: when an on-time after the PWM signal is enabled exceeds a preset minimum on-time, and when the modulation comparison signal indicates that an electrical characteristic of the output power reaches an output level, disabling the PWM signal to control the power switch to be turned off; and S4: when an off-time after the PWM signal is disabled exceeds a preset minimum off-time, and when the modulation comparison signal indicates that the electrical characteristic of the output power does not reach the output level, and when a present cycle period of the clock signal has reached the preset cycle period, returning to repeat the step S1.

13. The method of claim 12, wherein the switching power conversion circuit disables the PWM signal only when the modulation comparison signal indicates that the electrical characteristic of the output power reaches the output level, and after the PWM signal is disabled, the PWM signal is maintained disabled for at least the preset minimum off-time, and thereafter the step S1 is repeated, so that when a sum of the on-time and the preset minimum off-time is greater than the preset cycle period, the present cycle period of the clock signal is adaptively extended, whereby a ratio of the on-time to the present cycle period corresponds to a conversion ratio of an output voltage of the output power to an input voltage of the input power;

wherein the switching power conversion circuit repeats the step S1 when the modulation comparison signal indicates that the electrical characteristic of the output power does not reach the output level, so that when a sum the off-time and the preset minimum on-time is greater than the preset cycle period, the present cycle period is adaptively extended, whereby the ratio of the on-time to the present cycle period corresponds to the conversion ratio.

14. The method of claim 12, wherein an inductor current flowing through the inductor is greater than or equal to zero.

15. The method of claim 14, wherein the step S3 further comprises:

when the power stage circuit operates in a discontinuous conduction mode (DCM), the PWM signal is disabled only when the inductor current is determined to exceed a preset minimum current threshold.

16. The method of claim 15, wherein the on-time corresponding to the inductor current reaching the preset minimum current threshold is greater than or equal to the preset minimum on-time.

17. The method of claim 12, wherein the step S1 further comprises controlling the clock signal to change to a first state at the first changing edge, wherein the PWM circuit further generates the clock signal according to a timing procedure, wherein the timing procedure comprises:

S51: timing a preset first cycle period of the clock signal after the clock signal changes to the first state;

S52: triggering a second changing edge of the clock signal at an end of the preset first cycle period to control the clock signal to change to a second state;

S53: timing a preset second cycle period of the clock signal after the clock signal changes to the second state, wherein a sum of the preset first cycle period and the preset second cycle period is the preset cycle period; and S54: enabling a timing signal at an end of the preset second cycle period, wherein the timing signal indicates that the present cycle period has reached the preset cycle period;

wherein the step S4 further comprises:

repeating the step S1 only after the timing signal determines that the present cycle period has reached the preset cycle period.

* * * * *